(12) United States Patent
Yoshida et al.

(10) Patent No.: US 11,101,147 B2
(45) Date of Patent: Aug. 24, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventors: Yukifumi Yoshida, Kyoto (JP); Hiroaki Takahashi, Kyoto (JP); Masayuki Otsuji, Kyoto (JP); Manabu Okutani, Kyoto (JP); Chikara Maeda, Kyoto (JP); Hiroshi Abe, Kyoto (JP); Shuichi Yasuda, Kyoto (JP); Yasunori Kanematsu, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/203,719

(22) Filed: Nov. 29, 2018

(65) Prior Publication Data

US 2019/0176179 A1 Jun. 13, 2019

(30) Foreign Application Priority Data

Dec. 11, 2017 (JP) .............................. JP2017-237068

(51) Int. Cl.
*H01L 21/02* (2006.01)
*H01L 21/67* (2006.01)
(Continued)

(52) U.S. Cl.
CPC .......... *H01L 21/67028* (2013.01); *B05B 1/24* (2013.01); *B05D 1/005* (2013.01);
(Continued)

(58) Field of Classification Search
CPC ......... H01L 21/67017; H01L 21/67028; H01L 21/67098; H01L 21/67109; H01L 21/6715;
(Continued)

(56) References Cited

U.S. PATENT DOCUMENTS 5,803,970 A * 9/1998 Tateyama ................ G03F 7/162
118/319
2012/0175819 A1* 7/2012 Miya ........................ B08B 3/10
264/334

(Continued)

FOREIGN PATENT DOCUMENTS

JP 2008-288488 A 11/2008
JP 2010-050143 A 3/2010
(Continued)

OTHER PUBLICATIONS

Handbook of Organic Solvent Properties (Elsevier 1996). (Year: 1996).*

(Continued)

*Primary Examiner* — Mikhail Kornakov
*Assistant Examiner* — Richard Z. Zhang
(74) *Attorney, Agent, or Firm* — Ostrolenk Faber LLP

(57) ABSTRACT

A substrate processing method includes a first processing liquid supplying step of supplying a first processing liquid to an upper surface of the substrate, a holding layer forming step of solidifying or curing the first processing liquid to form a particle holding layer on the upper surface of the substrate, a holding layer removing step of peeling and removing the particle holding layer from the upper surface of the substrate, a liquid film forming step of forming, after removing the particle holding layer from the substrate, a liquid film of the second processing liquid, a solidifying step of cooling the liquid film to a temperature not more than a melting point of the sublimable substance to make the liquid film solidify on the substrate and form a solid film, and a sublimating step of sublimating and thereby removing the solid film from the substrate.

7 Claims, 22 Drawing Sheets

(51) Int. Cl.
*B08B 3/10* (2006.01)
*B05B 1/24* (2006.01)
*B05D 1/00* (2006.01)
*B08B 7/00* (2006.01)

(52) U.S. Cl.
CPC .............. *B08B 3/10* (2013.01); *B08B 7/0014* (2013.01); *H01L 21/02057* (2013.01); *H01L 21/6715* (2013.01); *H01L 21/67017* (2013.01); *H01L 21/67051* (2013.01); *H01L 21/02052* (2013.01)

(58) Field of Classification Search
CPC . H01L 21/68728; H01L 21/00; B08B 7/0014; B08B 3/04; B08B 3/08; B08B 3/10; B05B 12/10; B05B 1/24; B05D 1/005
See application file for complete search history.

(56) References Cited

U.S. PATENT DOCUMENTS

| | | | |
|---|---|---|---|
| 2013/0008868 A1 | 1/2013 | Uozumi et al. | 216/41 |
| 2014/0041685 A1 | 2/2014 | Kaneko et al. | 134/4 |
| 2014/0144465 A1* | 5/2014 | Kaneko | H01L 21/68728 134/4 |
| 2015/0064910 A1* | 3/2015 | Kaneko | B05B 7/00 438/694 |
| 2015/0128994 A1* | 5/2015 | Kaneko | H01L 21/02052 134/4 |
| 2015/0270145 A1* | 9/2015 | Inoue | H01L 21/67109 156/345.18 |
| 2016/0035561 A1 | 2/2016 | Aibara et al. | |
| 2016/0163534 A1 | 9/2016 | Kaneko et al. | |
| 2016/0351421 A1* | 12/2016 | Iwao | H01L 21/6708 |
| 2017/0345683 A1 | 11/2017 | Sasaki et al. | |
| 2018/0211828 A1 | 7/2018 | Chung et al. | |

FOREIGN PATENT DOCUMENTS

| | | | |
|---|---|---|---|
| JP | 2010-199261 A | | 9/2010 |
| JP | 2012-146696 A | | 8/2012 |
| JP | 2012175036 | * | 9/2012 |
| JP | 2013-016699 A | | 1/2013 |
| JP | 2013-033817 A | | 2/2013 |
| JP | 2014-011426 A | | 1/2014 |
| JP | 2014-197717 A | | 10/2014 |
| JP | 2015142069 | * | 8/2015 |
| JP | 2016-036012 A | | 3/2016 |
| KR | 10-2017-0075770 A | | 7/2017 |
| WO | WO 2017/056746 A1 | | 4/2017 |

OTHER PUBLICATIONS

Yaw's Handbook of Properties for Aqueous Systems (Knovel 2012). (Year: 2012).*

* cited by examiner

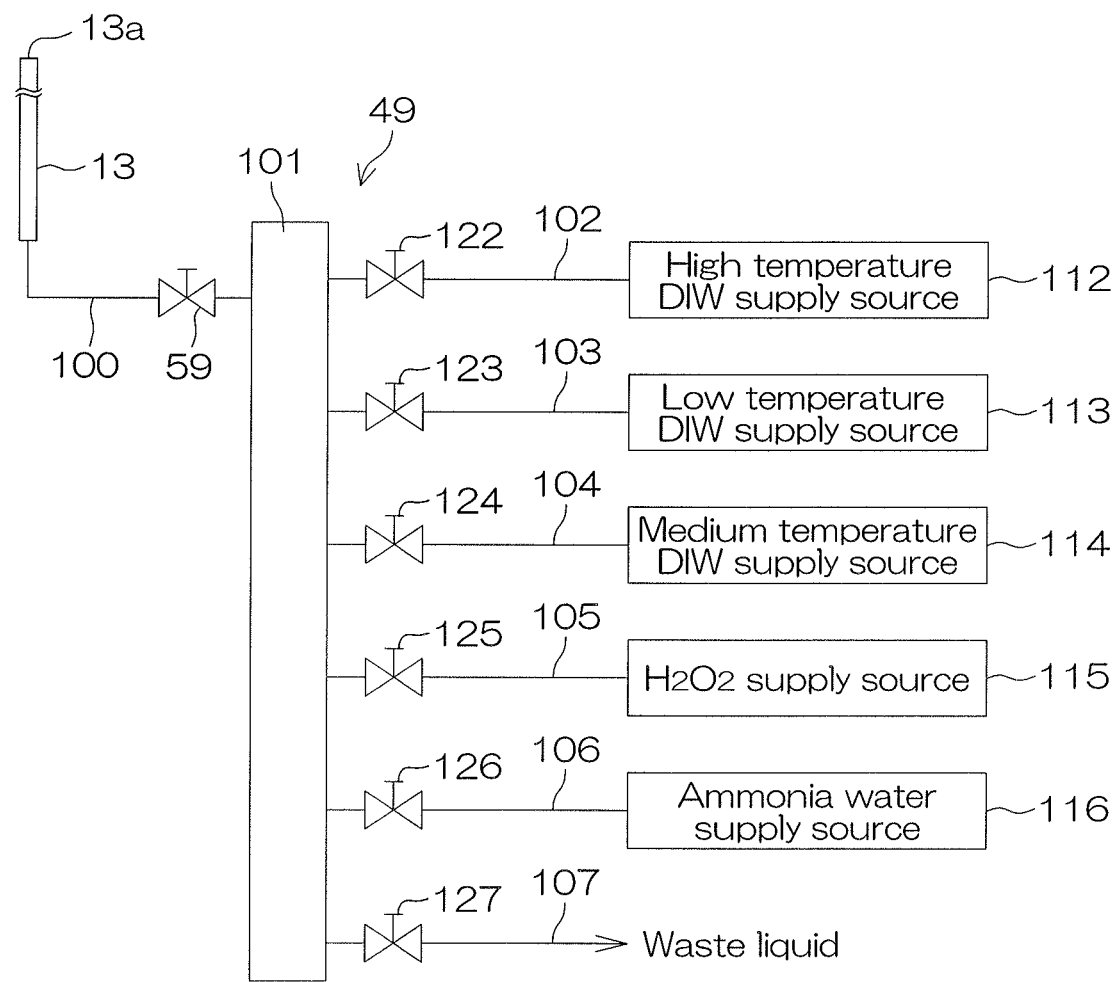

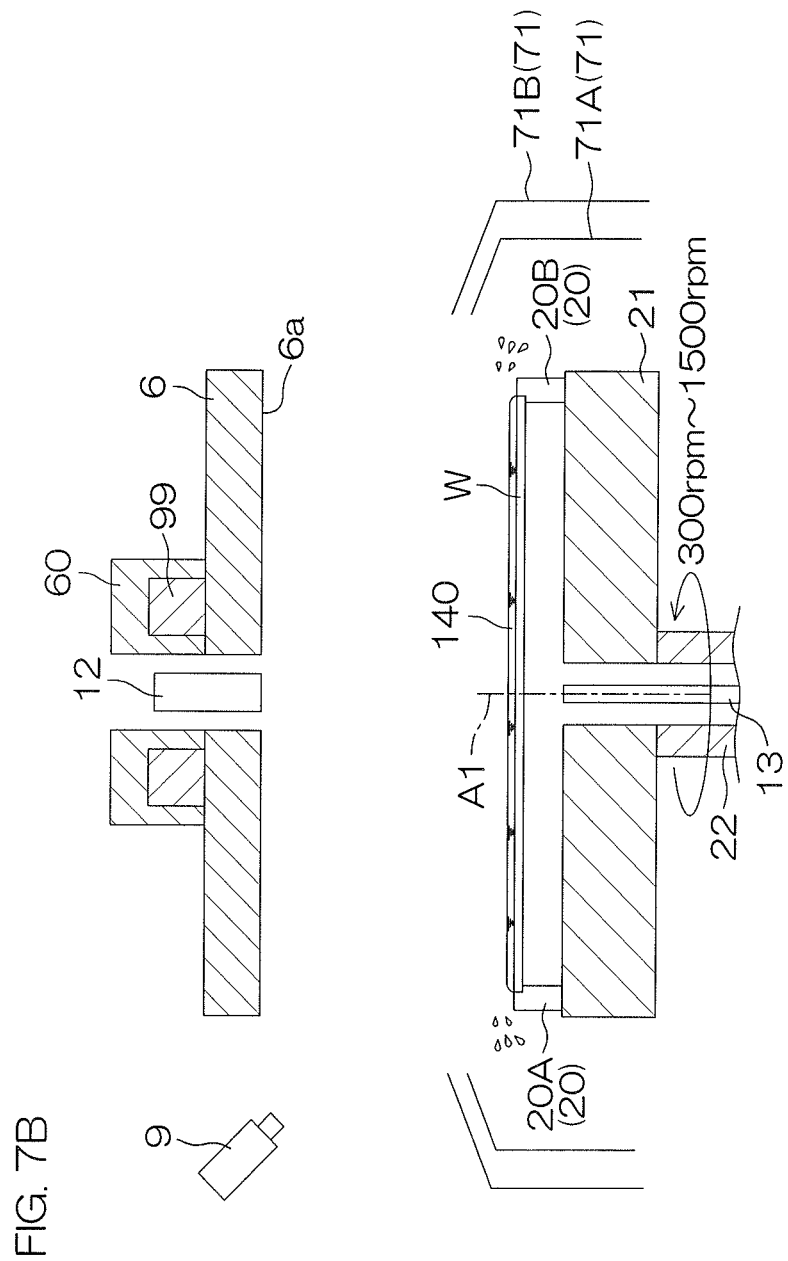

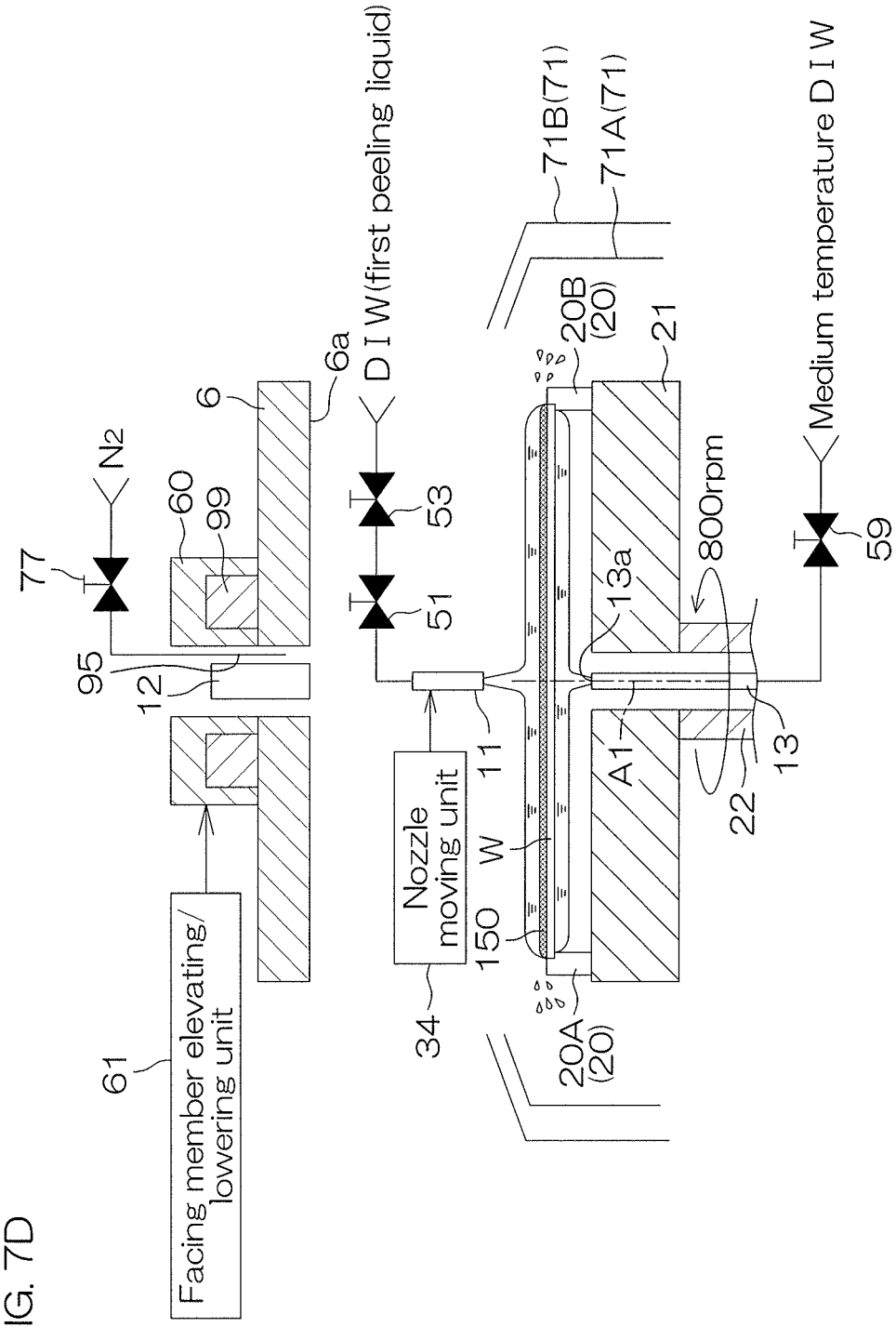

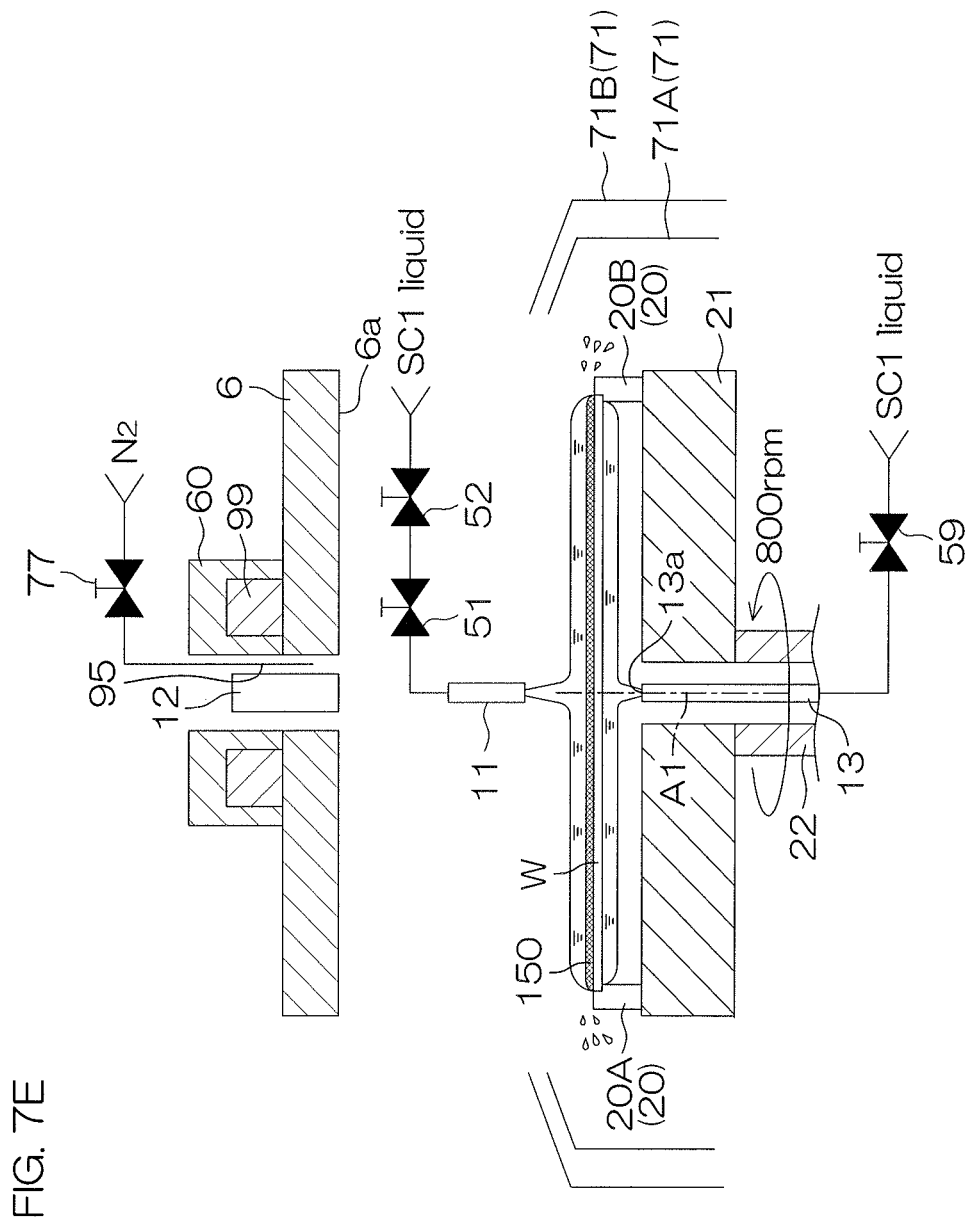

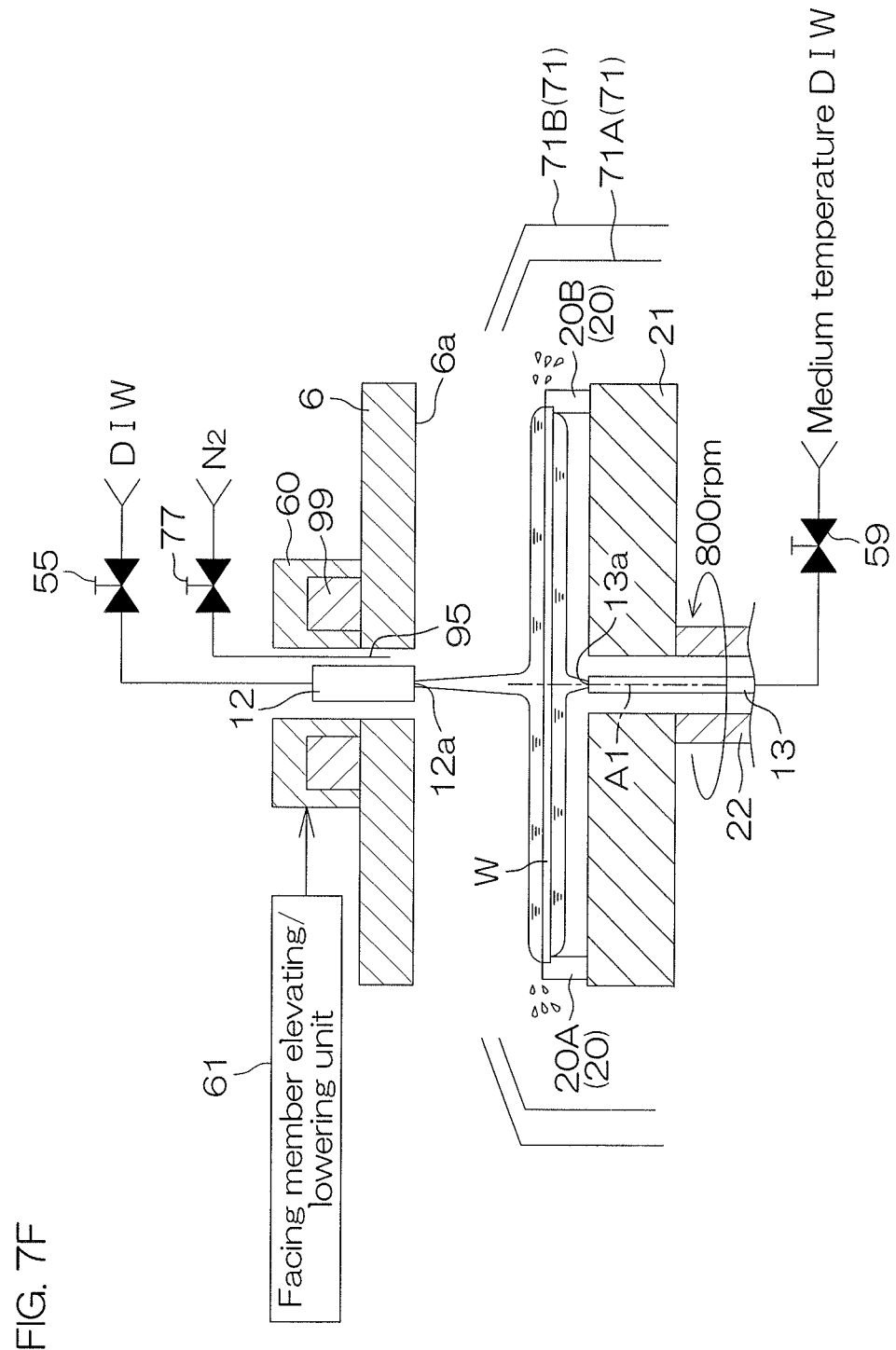

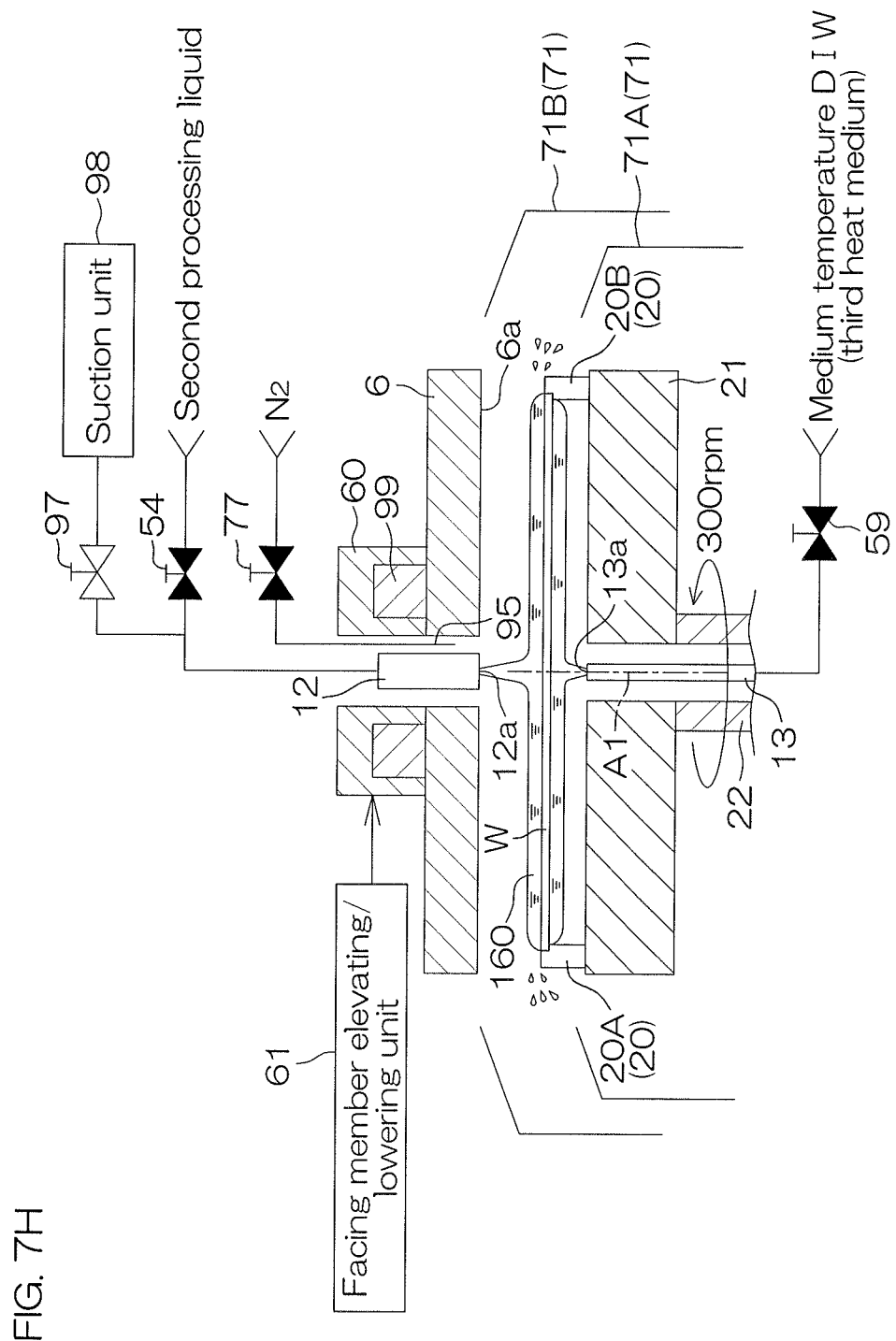

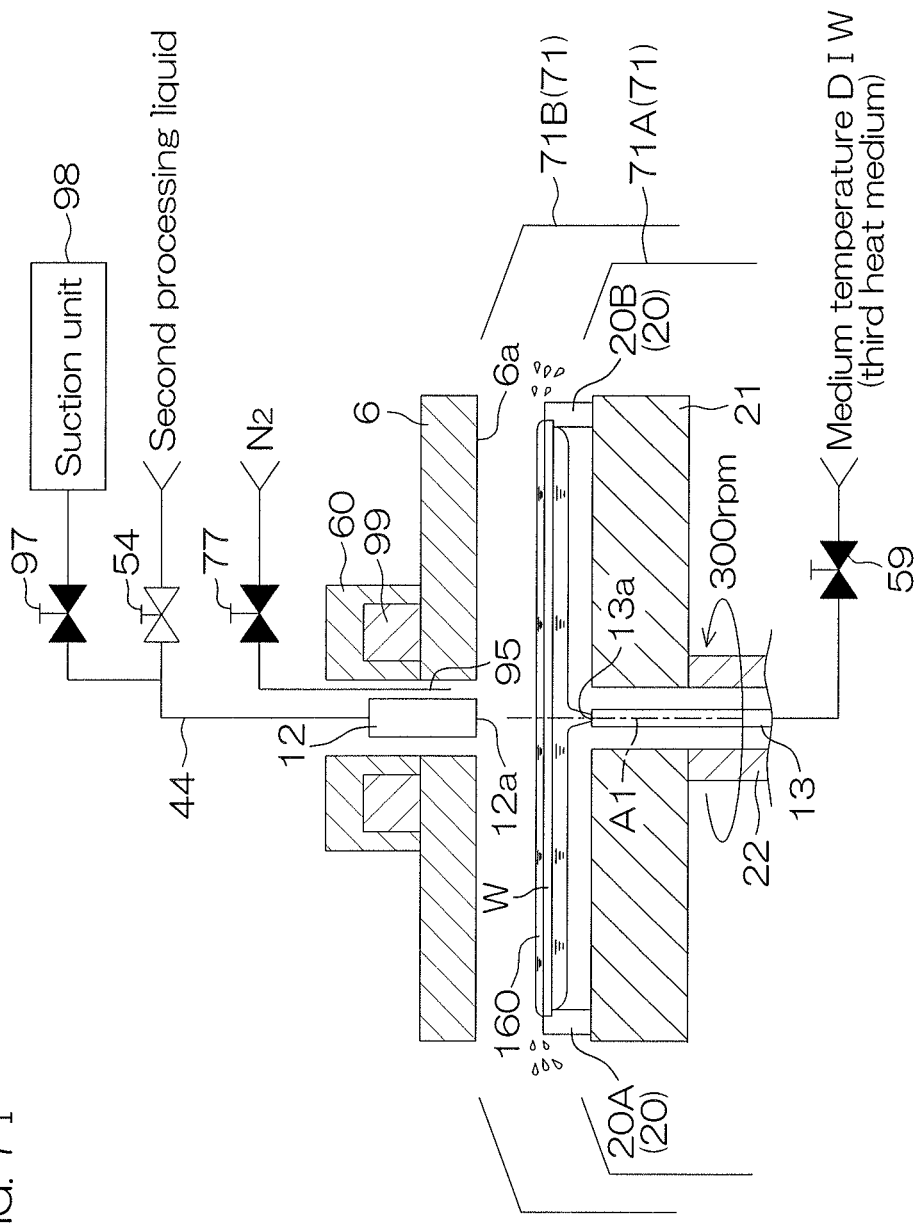

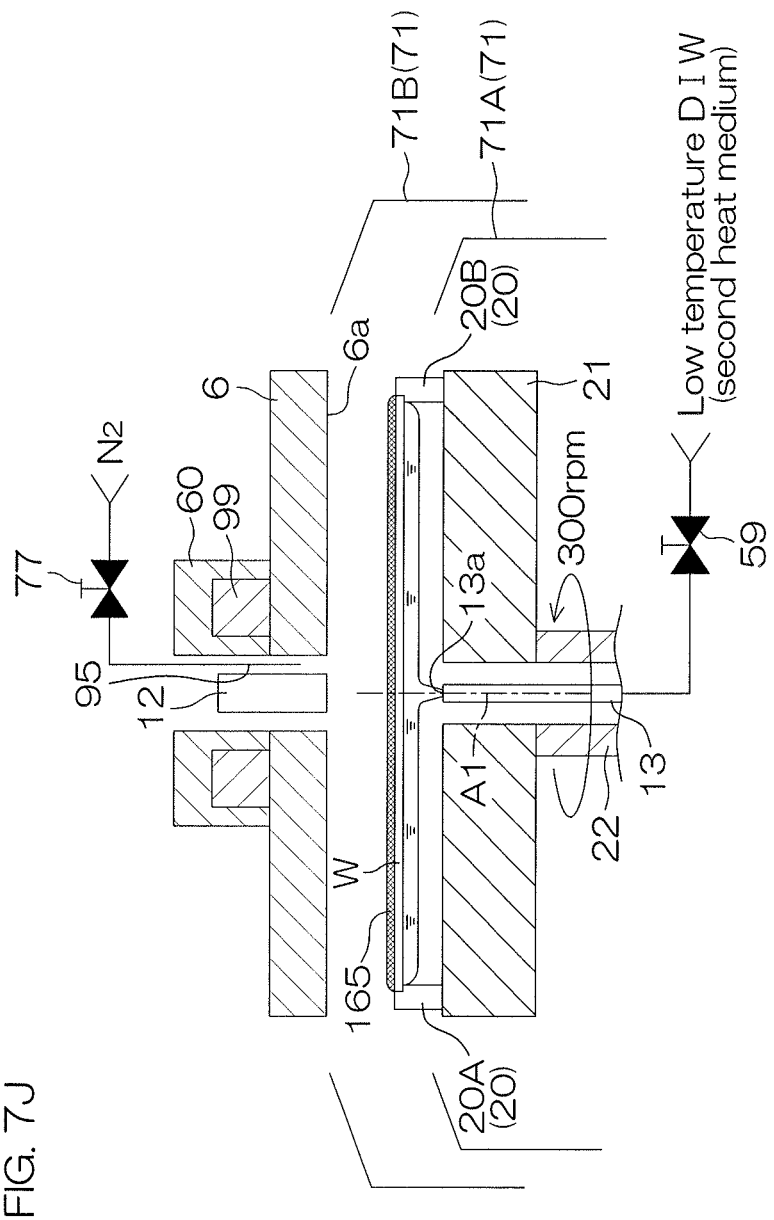

SUBSTRATE PROCESSING METHOD AND SUBSTRATE PROCESSING APPARATUS

CROSS REFERENCE TO RELATED APPLICATIONS

The present application claims priority to Japanese Patent Application No. 2017-237068 filed on Dec. 11, 2017. The entire content of this application are incorporated herein by reference.

BACKGROUND OF THE INVENTION

1. Field of the Invention

The present invention relates to a substrate processing method and a substrate processing apparatus for processing substrates. Examples of substrates to be processed include substrates, such as semiconductor wafers, substrates for liquid crystal display devices, substrates for FPDs (flat panel displays), such as organic EL (electroluminescence) display devices, etc., substrates for optical disks, substrates for magnetic disks, substrates for magneto-optical disks, substrates for photomasks, ceramic substrates, substrates for solar cells, etc.

2. Description of the Related Art

In substrate processing by a single substrate processing type substrate processing apparatus, substrates are processed one by one. In detail, a substrate is held substantially horizontally by a spin chuck. Then, after a cleaning step of cleaning an upper surface of the substrate is executed, a spin drying step of rotating the substrate at high speed to dry the upper surface of the substrate is performed.

In the cleaning step, various contaminants, a residue of a processing liquid or a resist, etc., used in a prior step, or various particles, etc., (may be referred to collectively hereinafter as "particles") that are attached to the substrate are removed. Specifically, in the cleaning step, the particles are removed physically by supplying a cleaning liquid, such as deionized water (DIW), to the substrate or the particles are removed chemically by supplying a chemical liquid that reacts chemically with the particles to the substrate.

However, with progresses being made in making a pattern formed on a substrate finer and more complex, it is becoming less easy to physically or chemically remove particles.

A method has thus been proposed where a processing liquid, containing a solute and a solvent having volatility, is supplied to the upper surface of a substrate, a film (hereinafter referred to as "particle holding layer") is formed by solidifying or curing the processing liquid, and the particle holding layer is thereafter removed (Japanese Patent Application Publication No. 2014-197717).

SUMMARY OF THE INVENTION

However, with the method described in Japanese Patent Application Publication No. 2014-197717, the particle holding layer is dissolved on the substrate by supplying a dissolving processing liquid to the upper surface of the substrate and therefore particles may fall off from the particle holding layer that is in the process of dissolving and become reattached to the substrate. A particle removal rate thus does not become as high as anticipated.

Moreover, the dissolving processing liquid, used to remove the particles, and a rinse liquid, arranged to wash away the dissolving processing liquid, enter into an interior of a pattern. Surface tension of the liquid that entered into the pattern interior acts on the pattern. The pattern may collapse due to this surface tension.

In detail, as shown in FIG. 11, when drying a front surface of the substrate, a liquid surface (interface between air and liquid) of the rinse liquid that entered into the pattern interior is formed inside the pattern. Surface tension of the liquid thus acts at a position of contact of the liquid surface and the pattern. Pattern collapse tends to occur when the surface tension is high. Water, which is a typical rinse liquid, is high in surface tension and pattern collapse in the spin drying step thus cannot be ignored.

Thus, an object of the present invention is to provide a substrate processing method and a substrate processing apparatus by which particles can be removed satisfactorily from an upper surface of a substrate and the upper surface of the substrate can be dried satisfactorily.

A preferred embodiment of the present invention provides a substrate processing method including a substrate holding step of horizontally holding a substrate, a first processing liquid supplying step of supplying a first processing liquid, containing a solute and a solvent having volatility, to an upper surface of the substrate, a holding layer forming step of supplying a first heat medium to a lower surface of the substrate to heat the first processing liquid on the substrate via the substrate and volatilize at least a portion of the solvent to solidify or cure the first processing liquid to form a particle holding layer on the upper surface of the substrate, a holding layer removing step of supplying a peeling liquid, which peels the particle holding layer, to the upper surface of the substrate to peel and remove the particle holding layer from the upper surface of the substrate, a liquid film forming step of supplying, after removing the particle holding layer from the substrate, a second processing liquid, containing a sublimable substance, to the upper surface of the substrate to form a liquid film of the second processing liquid which covers the upper surface of the substrate, a solidifying step of supplying a second heat medium to the lower surface of the substrate to cool the liquid film via the substrate to a temperature not more than a melting point of the sublimable substance to make the liquid film solidify on the substrate to form a solid film, and a sublimating step of sublimating and thereby removing the solid film from the substrate.

With the present method, the first processing liquid on the substrate is heated by the first heat medium via the substrate in the holding layer forming step. By the first processing liquid thereby being solidified or cured, the particle holding layer is formed on the upper surface of the substrate. When the first processing liquid is being solidified or cured, particles are pulled away from the substrate. The particles that are pulled away become held inside the particle holding layer. Therefore, by supplying the peeling liquid to the upper surface of the substrate in the holding layer removing step, the particle holding layer can be peeled and removed, in a state of holding the particles, from the upper surface of the substrate.

Also, with the present method, the liquid film of the second processing liquid that covers an entirety of the upper surface of the substrate is formed in the liquid film forming step. Then, in the solidifying step, the liquid film is cooled to the temperature not more than the melting point of the sublimable substance by supplying the second heat medium and the solid film is formed. The solid film is removed by sublimation. Therefore, the second processing liquid can be removed from the substrate and the upper surface of the substrate can be dried without letting surface tension of the second processing liquid act on the upper surface of the substrate. Collapse of a pattern formed on the upper surface of the substrate can thus be suppressed or prevented.

By the above, the particles can be removed satisfactorily from the upper surface of the substrate and the upper surface of the substrate can be dried satisfactorily.

In the preferred embodiment of the present invention, a solute component that is the solute contained in the first processing liquid has properties of being insoluble in the peeling liquid before being heated to not less than an alteration temperature and being altered and becoming soluble in the peeling liquid by being heated to not less than the alteration temperature. In the holding layer forming step, the substrate is heated such that a temperature of the first processing liquid, supplied to the upper surface of the substrate, becomes a temperature less than the alteration temperature.

With the present method, in the holding layer forming step, the substrate is heated such that the temperature of the first processing liquid becomes the temperature less than the alteration temperature and the particle holding layer is formed. Although the particle holding layer is thus poorly soluble or insoluble in the peeling liquid, it can be peeled by the peeling liquid. Therefore, in the holding layer removing step, the particle holding layer formed on the upper surface of the substrate can be peeled and removed, without dissolving it and with it being in the state of holding the particles, from the upper surface of the substrate.

Consequently, by peeling the particle holding layer, in the state of holding the particles, from the upper surface of the substrate, the particles can be removed at a high removal rate. Further, a residue, resulting from dissolution of the particle holding layer in the peeling liquid, can be suppressed from remaining on or reattaching to the upper surface of the substrate.

In the preferred embodiment of the present invention, in the holding layer forming step, the substrate is heated such that the temperature of the first processing liquid supplied to the upper surface of the substrate becomes less than a boiling point of the solvent.

With the present method, the solvent can be made to remain in the particle holding layer after the heating in the holding layer forming step. The particle holding layer can thus be made easily peelable from the upper surface of the substrate in the subsequent holding layer removing step by interaction of the solvent remaining in the particle holding layer and the peeling liquid that is supplied. That is, by making the peeling liquid permeate into the particle holding layer and making the peeling liquid reach an interface between the particle holding layer and the substrate, the particle holding layer can be lifted and peeled from the upper surface of the substrate.

In the preferred embodiment of the present invention, the peeling liquid has compatibility with the solvent. When the solvent is made to remain appropriately in the particle holding layer in the holding layer forming step, the peeling liquid that is compatible with the solvent can permeate into the particle holding layer and reach the interface between the particle holding layer and the substrate. The particle holding layer can thereby be lifted and peeled from the upper surface of the substrate.

In the preferred embodiment of the present invention, the substrate processing method further includes a residue removing step of supplying, after the holding layer removing step and before the liquid film forming step, a residue removing liquid, having a dissolving ability with respect to the solute component that is the solute contained in the first processing liquid, to the upper surface of the substrate to remove a residue remaining on the upper surface of the substrate after the particle holding layer is removed.

With the present method, the residue removing liquid has a property of dissolving the solute component that forms the particle holding layer. The residue of the particle holding layer (the particle holding layer that the peeling liquid could not peel) can thus be dissolved in the residue removing liquid to remove the residue from the upper surface of the substrate before supplying the second processing liquid to the upper surface of the substrate. The upper surface of the substrate can thereby be dried in a state where an amount of particles on the upper surface of the substrate is reduced further.

In the preferred embodiment of the present invention, the holding layer forming step includes a rotation elimination step of rotating the substrate around a rotational axis oriented along a vertical direction to eliminate a portion of the first processing liquid from the substrate and a substrate heating step of supplying the first heat medium to the lower surface of the substrate to heat the first processing liquid on the substrate via the substrate after the portion of the first processing liquid is eliminated from the substrate by rotation of the substrate.

When volatilizing the solvent of the first processing liquid in the holding layer forming step, particles, resulting from the solvent, may become attached to a member positioned in a vicinity of the substrate. As an amount of the solvent increases, an amount of the particles attaching to the member positioned in the vicinity of the substrate increases. After the holding layer removing step, the particles attached to the member positioned in the vicinity of the substrate may drift in an atmosphere and become reattached to the substrate. Thus, by supplying the first heat medium to the lower surface of the substrate to heat the first processing liquid on the substrate after the first processing liquid is eliminated appropriately from the substrate by the rotation of the substrate, an amount of the solvent that volatilizes can be reduced and an amount of the solvent attaching to the member positioned in the vicinity of the substrate can thus be reduced. Reattachment of particles to the substrate after the holding layer removing step can thus be suppressed.

In the preferred embodiment of the present invention, the substrate processing method further includes a detecting step of detecting interference fringes of the first processing liquid on the substrate. The holding layer forming step includes a first heating starting step of starting the heating of the substrate at a timing at which the interference fringes are no longer detected.

The present inventors found that by heating the substrate to volatilize the solvent of the first processing liquid in a state where an amount of the first processing liquid on the substrate is made an amount such that interference fringes are not formed, the amount of the particles attached onto the substrate after the forming of holding layer can be reduced sufficiently.

Thus, by starting the heating of the substrate at the timing at which the interference fringes are no longer detected, an amount of the solvent of the first processing liquid that is to be volatilized can be reduced appropriately. Reattachment of the particles to the substrate after the holding layer removing step can thereby be suppressed reliably.

In the preferred embodiment of the present invention, the holding layer forming step includes a supply stopping step of stopping the supply of the first processing liquid to the upper surface of the substrate and a second heating starting step of starting the heating of the substrate after elapse of a predetermined time from the stopping of the supply of the first processing liquid.

The present inventors found that a time required for the interference fringes to disappear (disappearance requirement time) can be predicted based on a rotational speed of the substrate. The amount of the solvent of the first processing liquid that is to be volatilized can thus be reduced appropriately by starting the heating of the substrate after elapse of the disappearance requirement time from the stopping of the supply of the first processing liquid. Reattachment of the particles to the substrate after the holding layer removing step can thereby be suppressed reliably.

In the preferred embodiment of the present invention, the substrate processing method further includes a temperature holding step of supplying a third heat medium to the lower surface of the substrate to hold a temperature of the liquid film, after the supply of the second processing liquid is stopped, within a temperature range of not less than the melting point of the sublimable substance and less than a boiling point of the sublimable substance and a film thinning step of removing a portion of the second processing liquid, constituting the liquid film, from the upper surface of the substrate while the temperature of the liquid film is within the temperature range to thin the liquid film.

With the present method, by holding the temperature of the liquid film of the second processing liquid within the above-stated temperature range in the temperature holding step, solidification of the liquid film can be suppressed and the second processing liquid on the substrate can be maintained in a liquid phase before the solidifying step. For example, even if the liquid film of the second processing liquid undergoes partial solidification in the liquid film forming step, it can be remelted and put in liquid form in the temperature holding step.

In the film thinning step, by removing excess second processing liquid while the temperature of the liquid film of the second processing liquid is within the above-stated temperature range and solidification of the liquid film of the second processing liquid does not occur, a film thickness of the solid film formed in the solidifying step can be reduced appropriately. By reducing the film thickness of the solid film, an internal stress that remains in the solid film can be reduced. A force that acts on the upper surface of the substrate due to the internal stress can thus be reduced and pattern collapse can thus be suppressed further. Therefore, by sublimating and removing the solid film in the subsequent sublimating step, the upper surface of the substrate can be dried while further suppressing pattern collapse.

In the preferred embodiment of the present invention, the substrate processing method further includes a guard disposing step of disposing a guard at a side of the substrate in the first processing liquid supplying step and a proximity disposing step of disposing a facing member, having a facing surface facing the upper surface of the substrate, at a proximity position in proximity to the upper surface of the substrate in the holding layer forming step.

The first heat medium supplied to the lower surface of the substrate in the holding layer forming step splashes outside the substrate. The first heat medium that splashed outside the substrate is received by the guard disposed at the side of the substrate. A portion of the first heat medium received by the guard splashes back from the guard. Thus, by putting the facing member in proximity to the upper surface of the substrate in the holding layer forming step, attachment of the first heat medium to a front surface of the particle holding layer can be suppressed. Particles resulting from the splashing back of the first heat medium from the guard can thus be suppressed.

In the preferred embodiment of the present invention, the liquid film forming step includes a liquid feeding step of feeding the second processing liquid toward a discharge port, provided at the facing surface of the facing member, via a second processing liquid piping, a discharging step of discharging the second processing liquid toward the upper surface of the substrate from the discharge port, and a suctioning step of suctioning the second processing liquid inside the second processing liquid piping after end of the discharging step.

After the end of the discharging step, the second processing liquid remains inside the second processing liquid piping and at the discharge port. Thus, by suctioning the second processing liquid inside the second processing liquid piping after the end of the discharging step, the second processing liquid can be removed from the second processing liquid piping and the discharge port before the second processing liquid solidifies. Solidification due to heat of vaporization of the second processing liquid remaining inside the second processing liquid piping and at the discharge port can thus be suppressed. Clogging of the second processing liquid piping can thus be suppressed or prevented.

In the preferred embodiment of the present invention, the substrate processing method further includes a processing liquid piping temperature holding step of holding a temperature of the second processing liquid piping within a control temperature range of not less than the melting point of the sublimable substance and less than the boiling point of the sublimable substance. The second processing liquid remaining inside the second processing liquid piping can thus be heated and therefore the solidification of the second processing liquid remaining inside the second processing liquid piping and at the discharge port can be suppressed or prevented.

In the preferred embodiment of the present invention, the substrate holding step includes a step of making a state, in which the substrate is held by a substrate holding unit, provided inside a chamber, continue until the sublimating step ends.

With the present method, the first processing liquid supplying step, the holding layer forming step, the holding layer removing step, the liquid film forming step, the solidifying step, and the sublimating step can be executed inside a single chamber without having to transfer the substrate to another chamber in the middle of the substrate processing. Time necessary for processing a single substrate (throughput) can thus be reduced.

In the preferred embodiment of the present invention, the substrate holding step includes a first substrate gripping step of gripping the substrate by both a plurality of first gripping pins and a plurality of second gripping pins provided in the substrate holding unit, a first separating step of gripping the substrate by the plurality of second gripping pins and separating the plurality of first gripping pins from the substrate, a second separating step of gripping the substrate by the plurality of first gripping pins and separating the plurality of second gripping pins from the substrate, and a second substrate gripping step of gripping the substrate by both the plurality of first gripping pins and the plurality of second gripping pins after the first separating step and the second separating step. Also, the first separating step, the second separating step, and the second substrate gripping step are executed while the peeling liquid is being supplied onto the substrate in the holding layer removing step.

The peeling liquid does not readily reach portions of the substrate that are in contact with the first gripping pins or the second gripping pins. Thus, by passing through a state where the plurality of first gripping pins are separated from the substrate and a state where the plurality of second gripping pins are separated from the substrate while the peeling liquid is being supplied onto the substrate in the holding layer removing step, the peeling liquid can be supplied sufficiently to the portions of the substrate that are in contact with the first gripping pins or the second gripping pins. The particle holding layer can thus be removed sufficiently from the upper surface of the substrate in the holding layer removing step.

In the preferred embodiment of the present invention, the holding layer forming step includes a step of heating the first processing liquid on the substrate via the substrate by discharging the first heat medium from a lower surface nozzle facing the lower surface of the substrate. Also, the solidifying step includes a step of cooling the liquid film via the substrate by discharging the second heat medium from the lower surface nozzle. Also, the substrate processing method further includes a heat medium supply piping heating step of heating a heat medium supply piping which supplies the first heat medium and the second heat medium toward the lower surface nozzle, by supplying the first heat medium to the heat medium supply piping after the solidifying step.

When the second heat medium is discharged from the lower surface nozzle, the heat medium supply piping which supplies the second heat medium to the lower surface nozzle, is cooled. Therefore, when after ending the substrate processing of one substrate, the substrate processing of the next substrate is started, the first heat medium may be discharged from the lower surface nozzle through the cooled heat medium supply piping in the holding layer forming step. Thus, by supplying the first heat medium to heat the heat medium supply piping in advance after the solidifying step, it is made possible, in the holding layer forming step of the substrate processing of the next substrate, to heat the first processing liquid on the substrate to the desired temperature.

A preferred embodiment of the present invention provides a substrate processing apparatus including a substrate holding unit which holds a substrate horizontally, a first processing liquid supplying unit which supplies, to an upper surface of the substrate, a first processing liquid, which contains a solute and a solvent having volatility and is the first processing liquid that is solidified or cured by at least a portion of the solvent volatilizing to form a particle holding layer on the upper surface of the substrate, a first heat medium supplying unit which supplies a first heat medium, which heats the substrate, to a lower surface of the substrate, a peeling liquid supplying unit which supplies a peeling liquid, which peels the particle holding layer, to the upper surface of the substrate, a second processing liquid supplying unit which supplies a second processing liquid, containing a sublimable substance, to the upper surface of the substrate, a second heat medium supplying unit which supplies a second heat medium, which cools the substrate, to the lower surface of the substrate, a sublimating unit which sublimates a solid film formed from the second processing liquid, and a controller which controls the substrate holding unit, the first processing liquid supplying unit, the first heat medium supplying unit, the peeling liquid supplying unit, the second processing liquid supplying unit, the second heat medium supplying unit, and the sublimating unit.

The controller is programmed to execute a substrate holding step of horizontally holding the substrate by the substrate holding unit, a first processing liquid supplying step of supplying the first processing liquid from the first processing liquid supplying unit to the upper surface of the substrate, a holding layer forming step of supplying the first heat medium from the first heat medium supplying unit to heat the first processing liquid on the substrate via the substrate to solidify or cure the first processing liquid to form the particle holding layer on the upper surface of the substrate, a holding layer removing step of supplying the peeling liquid from the peeling liquid supplying unit to the upper surface of the substrate to peel and remove the particle holding layer from the upper surface of the substrate, a liquid film forming step of supplying the second processing liquid from the second processing liquid supplying unit to the upper surface of the substrate to form a liquid film of the second processing liquid which covers the upper surface of the substrate, a solidifying step of supplying the second heat medium from the second heat medium supplying unit to the lower surface of the substrate to cool the liquid film via the substrate to a temperature not more than a melting point of the sublimable substance to make the liquid film solidify to form a solid film, and a sublimating step of sublimating the solid film by the sublimating unit to remove the solid film from the substrate.

With the present configuration, the first processing liquid on the substrate is heated by the first heat medium via the substrate in the holding layer forming step. By the first processing liquid thereby being solidified or cured, the particle holding layer is formed on the upper surface of the substrate. When the first processing liquid is being solidified or cured, particles are pulled away from the substrate. The particles that are pulled away become held inside the particle holding layer. Therefore, in the holding layer removing step, the particle holding layer in a state of holding the particles can be peeled and removed from the upper surface of the substrate by supplying the peeling liquid to the upper surface of the substrate.

Also, with the present configuration, the liquid film of the second processing liquid that covers an entirety of the upper surface of the substrate is formed in the liquid film forming step. Then, in the solidifying step, the liquid film is cooled to the temperature not more than the melting point of the sublimable substance by supplying the second heat medium and the solid film is formed. The solid film is removed by sublimation. Therefore, the second processing liquid can be removed from the substrate and the upper surface of the substrate can be dried without letting surface tension of the second processing liquid act on the upper surface of the substrate. Collapse of a pattern formed on the upper surface of the substrate can thus be suppressed or prevented.

By the above, the particles can be removed satisfactorily from the upper surface of the substrate and the upper surface of the substrate can be dried satisfactorily.

In the preferred embodiment of the present invention, a solute component that is the solute contained in the first processing liquid has properties of being insoluble in the peeling liquid before being heated to not less than an alteration temperature and being altered and becoming soluble in the peeling liquid by being heated to not less than the alteration temperature. Also, the controller is programmed to supply the first heat medium from the first heat medium supplying unit in the holding layer forming step such as to heat the substrate such that a temperature of the first processing liquid, supplied to the upper surface of the substrate, becomes a temperature less than the alteration temperature.

With the present configuration, in the holding layer forming step, the substrate is heated such that the temperature of the first processing liquid becomes the temperature less than the alteration temperature and the particle holding layer is formed. Although the particle holding layer is thus poorly soluble or insoluble in the peeling liquid, it can be peeled by the peeling liquid. Therefore, in the holding layer removing step, the particle holding layer formed on the upper surface of the substrate can be peeled and removed, without dissolving the particle holding layer and with the particle holding layer being in the state of holding the particles, from the upper surface of the substrate.

Consequently, by peeling the particle holding layer, in the state of holding the particles, from the upper surface of the substrate, the particles can be removed at a high removal rate. Further, a residue, resulting from dissolution of the particle holding layer in the peeling liquid, can be suppressed from remaining on or reattaching to the upper surface of the substrate.

In the preferred embodiment of the present invention, the controller is programmed to supply the first heat medium from the first heat medium supplying unit in the holding layer forming step so as to heat the substrate such that the temperature of the first processing liquid supplied to the upper surface of the substrate becomes less than a boiling point of the solvent.

With the present configuration, the solvent can be made to remain in the particle holding layer after the heating in the holding layer forming step. The particle holding layer can thus be made easily peelable from the upper surface of the substrate in the subsequent holding layer removing step by interaction of the solvent remaining in the particle holding layer and the peeling liquid that is supplied. That is, by making the peeling liquid permeate into the particle holding layer and making the peeling liquid reach an interface between the particle holding layer and the substrate, the particle holding layer can be lifted and peeled from the upper surface of the substrate.

In the preferred embodiment of the present invention, the peeling liquid has compatibility with the solvent. When the solvent is made to remain appropriately in the particle holding layer in the holding layer forming step, the peeling liquid that is compatible with the solvent can permeate into the particle holding layer and reach the interface between the particle holding layer and the substrate. The particle holding layer can thereby be lifted and peeled from the upper surface of the substrate.

In the preferred embodiment of the present invention, the substrate processing apparatus further includes a residue removing liquid supplying unit which supplies a residue removing liquid, having a dissolving ability with respect to the solute component that is the solute contained in the first processing liquid, to the upper surface of the substrate. Also, the controller is programmed to execute, after the holding layer removing step and before the liquid film forming step, a residue removing step of supplying the residue removing liquid from the residue removing liquid supplying unit to the upper surface of the substrate to remove a residue remaining on the upper surface of the substrate after the particle holding layer is removed.

With the present configuration, the residue removing liquid has a property of dissolving the solute component that forms the particle holding layer. The residue of the particle holding layer (the particle holding layer that could not be peeled by the peeling liquid) can thus be dissolved in the residue removing liquid to remove the residue from the upper surface of the substrate before supplying the second processing liquid to the upper surface of the substrate. The upper surface of the substrate can thereby be dried in a state where an amount of particles on the upper surface of the substrate is reduced further.

In the preferred embodiment of the present invention, the substrate processing apparatus further includes a substrate rotating unit which rotates the substrate around a rotational axis oriented along a vertical direction.

The controller is programmed to execute, in the holding layer forming step, a rotation elimination step of making the substrate rotating unit rotate the substrate to remove the first processing liquid from the substrate and is programmed to execute, in the holding layer forming step, a substrate heating step of supplying the first heat medium from the first heat medium supplying unit to the lower surface of the substrate to heat the first processing liquid on the substrate via the substrate after a portion of the first processing liquid is eliminated from the substrate by rotation of the substrate.

When volatilizing the solvent of the first processing liquid in the holding layer forming step, particles, resulting from the solvent, may become attached to a member positioned in a vicinity of the substrate. An amount of the particles attaching to the member positioned in the vicinity of the substrate increases as an amount of the solvent increases. After the holding layer removing step, the particles attached to the member positioned in the vicinity of the substrate may drift in an atmosphere and become reattached to the substrate. Thus, by supplying the first heat medium to the lower surface of the substrate to heat the first processing liquid on the substrate after the first processing liquid is eliminated appropriately from the substrate by the rotation of the substrate, an amount of the solvent that volatilizes can be reduced and an amount of the solvent attaching to the member positioned in the vicinity of the substrate can thus be reduced. Reattachment of particles to the substrate after the holding layer removing step can thus be suppressed.

In the preferred embodiment of the present invention, the substrate processing apparatus further includes a detecting unit that detects interference fringes of the first processing liquid on the substrate. Also, the controller is programmed to execute a detecting step of detecting the interference fringes by the detecting unit and a first heating starting step of starting, in the holding layer forming step, the heating of the substrate at a timing at which the interference fringes are no longer detected by the detecting unit.

The present inventors found that by heating the substrate to volatilize the solvent of the first processing liquid in a state where a thickness of the first processing liquid on the substrate is made a thickness such that interference fringes are not formed, the amount of the particles attached onto the substrate after the forming of holding layer can be reduced sufficiently.

Thus, by starting the heating of the substrate at the timing at which the interference fringes are no longer detected, an amount of the solvent of the first processing liquid that is to be volatilized can be reduced appropriately. Reattachment of the particles to the substrate after the holding layer removing step can thereby be suppressed reliably.

In the preferred embodiment of the present invention, the controller is programmed to execute, in the holding layer forming step, a supply stopping step of stopping the supply of the first processing liquid to the upper surface of the substrate and is programmed to execute, in the holding layer forming step, a second heating starting step of starting the heating of the substrate after elapse of a predetermined time from the stopping of the supply of the first processing liquid.

The present inventors found that a time required for the interference fringes to disappear (disappearance requirement time) can be predicted based on a rotational speed of the substrate. The amount of the solvent of the first processing liquid that is to be volatilized can thus be reduced appropriately by starting the heating of the substrate after elapse of the disappearance requirement time from the stopping of the supply of the first processing liquid. Reattachment of the particles to the substrate after the holding layer removing step can thereby be suppressed reliably.

In the preferred embodiment of the present invention, the substrate processing apparatus further includes a third heat medium supplying unit which supplies a third heat medium to the lower surface of the substrate, and a removing unit which removes the second processing liquid from the substrate.

Also, the controller is programmed to execute a temperature holding step of supplying the third heat medium from the third heat medium supplying unit to the lower surface of the substrate to hold a temperature of the liquid film, after the supply of the second processing liquid is stopped, within a temperature range of not less than the melting point of the sublimable substance and less than a boiling point of the sublimable substance and a film thinning step, where the removing unit removes a portion of the second processing liquid, constituting the liquid film, from the upper surface of the substrate while the temperature of the liquid film is within the temperature range to thin the liquid film.

With the present configuration, by holding the temperature of the liquid film of the second processing liquid within the above-stated temperature range in the temperature holding step, solidification of the liquid film can be suppressed and the second processing liquid on the substrate can be maintained in a liquid phase before the solidifying step. For example, even if the liquid film of the second processing liquid undergoes partial solidification in the liquid film forming step, it can be remelted and put in liquid form in the temperature holding step.

In the film thinning step, by removing excess second processing liquid while the temperature of the liquid film of the second processing liquid is within the above-stated temperature range and solidification of the liquid film of the second processing liquid does not occur, a film thickness of the solid film formed in the solidifying step can be reduced appropriately. An internal stress that remains in the solid film can thereby be reduced. A force that acts on the upper surface of the substrate due to the internal stress can thus be reduced and pattern collapse can thus be suppressed further. Therefore, by sublimating and removing the solid film in the subsequent sublimating step, the upper surface of the substrate can be dried while further suppressing pattern collapse.

In the preferred embodiment of the present invention, the substrate processing apparatus further includes a guard, disposed at a side of the substrate, and a facing member which has a facing surface facing the upper surface of the substrate and is elevated and lowered with respect to the substrate. Also, the controller is programmed to execute, in the holding layer forming step, a proximity disposing step of disposing the facing member at a proximity position in proximity to the upper surface of the substrate.

The first heat medium supplied to the lower surface of the substrate in the holding layer forming step splashes outside the substrate. The first heat medium that splashed outside the substrate is received by the guard disposed at the side of the substrate. A portion of the first heat medium received by the guard splashes back from the guard. Thus, by putting the facing member in proximity to the upper surface of the substrate in the holding layer forming step, attachment of the first heat medium to a front surface of the particle holding layer can be suppressed. Particles resulting from the splashing back of the first heat medium from the guard can thus be suppressed.

In the preferred embodiment of the present invention, the second processing liquid supplying unit includes a discharge port, provided at the facing surface of the facing member, and a second processing liquid piping which supplies the second processing liquid to the discharge port. Also, the substrate processing apparatus further includes a suction unit that suctions the second processing liquid piping.

After discharge of the second processing liquid from the discharge port ends, the second processing liquid remains inside the second processing liquid piping and at the discharge port. Thus, by suctioning the second processing liquid inside the second processing liquid piping after the end of the discharge of the second processing liquid, the second processing liquid can be removed from the second processing liquid piping and the discharge port before the second processing liquid solidifies. Solidification due to heat of vaporization of the second processing liquid remaining inside the second processing liquid piping and at the discharge port can thus be suppressed. Clogging of the second processing liquid piping can thus be suppressed or prevented.

In the preferred embodiment of the present invention, the substrate processing apparatus further includes a second processing liquid piping temperature holding unit that holds a temperature of the second processing liquid piping within a control temperature range of not less than the melting point of the sublimable substance and less than the boiling point of the sublimable substance. The second processing liquid remaining inside the second processing liquid piping and at the discharge port can thus be heated and therefore the solidification of the second processing liquid remaining inside the second processing liquid piping and at the discharge port can be suppressed or prevented.

In the preferred embodiment of the present invention, the substrate processing apparatus further includes a chamber, housing the substrate holding unit. Also, the controller is programmed to continue the substrate holding step until the sublimating step ends.

With the present configuration, the first processing liquid supplying step, the holding layer forming step, the holding layer removing step, the liquid film forming step, the solidifying step, and the sublimating step can be executed inside a single chamber without having to transfer the substrate to another chamber in the middle of the substrate processing. Throughput can thus be reduced.

In the preferred embodiment of the present invention, the substrate holding unit includes a plurality of first gripping pins and a plurality of second gripping pins that hold the substrate.

Also, the controller is programmed to execute, in the substrate holding step, a first substrate gripping step of gripping the substrate by both the plurality of first gripping pins and the plurality of second gripping pins, a first separating step, where the substrate is gripped by the plurality of second gripping pins and the plurality of first gripping pins are separated from the substrate, a second separating step, where the substrate is gripped by the plurality of first gripping pins and the plurality of second gripping pins are separated from the substrate, and a second substrate gripping step of gripping the substrate by both the plurality of first gripping pins and the plurality of second gripping pins after the first separating step and the second separating step. Also, the first separating step, the second separating step, and the second substrate gripping step are executed while the peeling liquid is being supplied onto the substrate in the holding layer removing step.

The peeling liquid does not readily reach portions of the substrate that are in contact with the first gripping pins or the second gripping pins. Thus, by passing through a state where the plurality of first gripping pins are separated from the substrate and a state where the plurality of second gripping pins are separated from the substrate while the peeling liquid is being supplied onto the substrate in the holding layer removing step, the peeling liquid can be supplied sufficiently to the portions of the substrate that are in contact with the first gripping pins or the second gripping pins. The particle holding layer can thus be removed sufficiently from the upper surface of the substrate in the holding layer removing step.

In the preferred embodiment of the present invention, the substrate processing apparatus further includes a lower surface nozzle which discharges the first heat medium and the second heat medium toward the lower surface of the substrate, and a heat medium supply piping which is connected to the lower surface nozzle. Also, the controller is programmed to execute a heat medium supply piping heating step of heating the heat medium supply piping by supplying the first heat medium to the heat medium supply piping after the solidifying step.

When the second heat medium is discharged from the lower surface nozzle, the heat medium supply piping, which supplies the second heat medium to the lower surface nozzle, is cooled. Therefore, when after ending the substrate processing of one substrate, the substrate processing of the next substrate is started, the first heat medium may be discharged from the lower surface nozzle through the cooled heat medium supply piping in the holding layer forming step. Thus, by supplying the first heat medium to heat the heat medium supply piping in advance after the solidifying step, it is made possible, in the holding layer forming step of the substrate processing of the next substrate, to heat the first processing liquid on the substrate to the desired temperature.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a schematic view of a heat medium supply piping included in the substrate processing apparatus.

FIG. 7A to FIG. 7L are illustrative sectional views for describing the substrate processing.

DETAILED DESCRIPTION OF THE PREFERRED EMBODIMENTS

Figure 1:
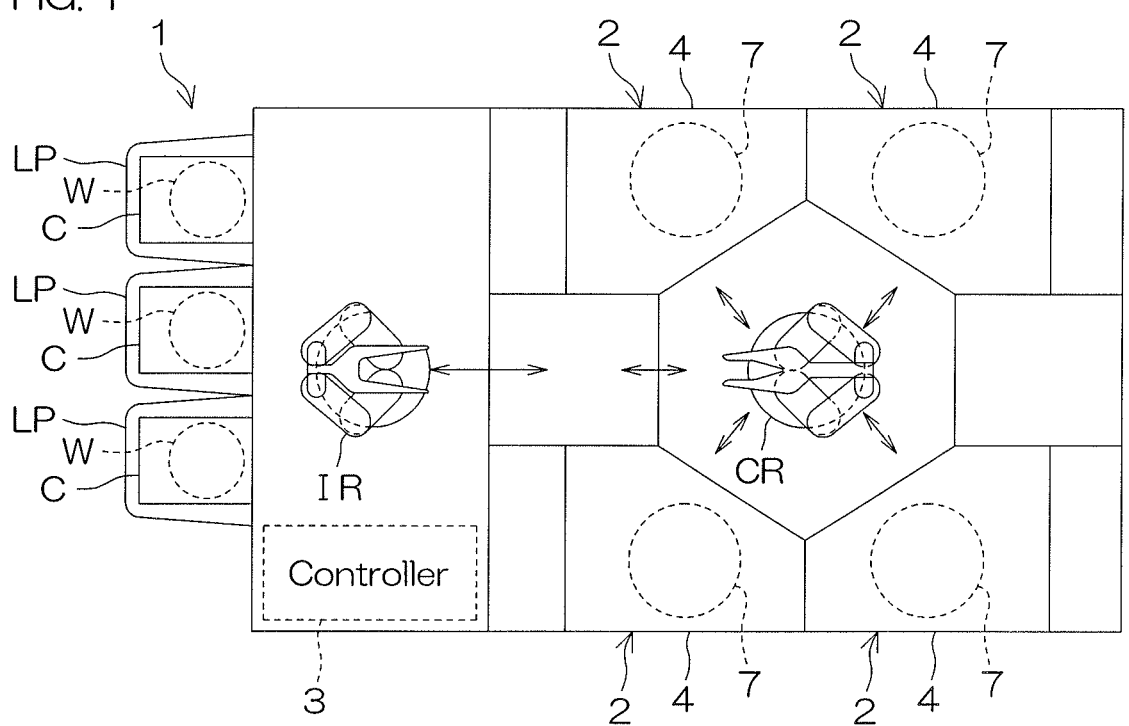
FIG. 1 is a schematic plan view for describing a layout of an interior of a substrate processing apparatus according to a preferred embodiment of the present invention.

FIG. 1 is a schematic plan view for describing a layout of an interior of a substrate processing apparatus 1 according to a preferred embodiment of the present invention. The substrate processing apparatus 1 is a single substrate processing type apparatus that processes substrates W, such as silicon wafers, etc., one at a time. Referring to FIG. 1, the substrate processing apparatus 1 includes a plurality of processing units 2 that process the substrates W with processing fluids, load ports LP, in which are placed carriers C that house the plurality of substrates W to be processed by the processing units 2, transfer robots IR and CR, transferring the substrates W between the load ports LP and the processing units 2, and a controller 3 controlling the substrate processing apparatus 1.

The transfer robot IR transfers the substrates W between the carriers C and the transfer robot CR. The transfer robot CR transfers the substrates W between the transfer robot IR and the processing units 2. The plurality of processing units 2 have, for example, the same configuration. The processing fluids include liquids, such as a first processing liquid, a second processing liquid, a rinse liquid, peeling liquids, a residue removing liquid, heat medium, etc., and a gas, such as an inert gas, etc., to be described later.

Figure 2:
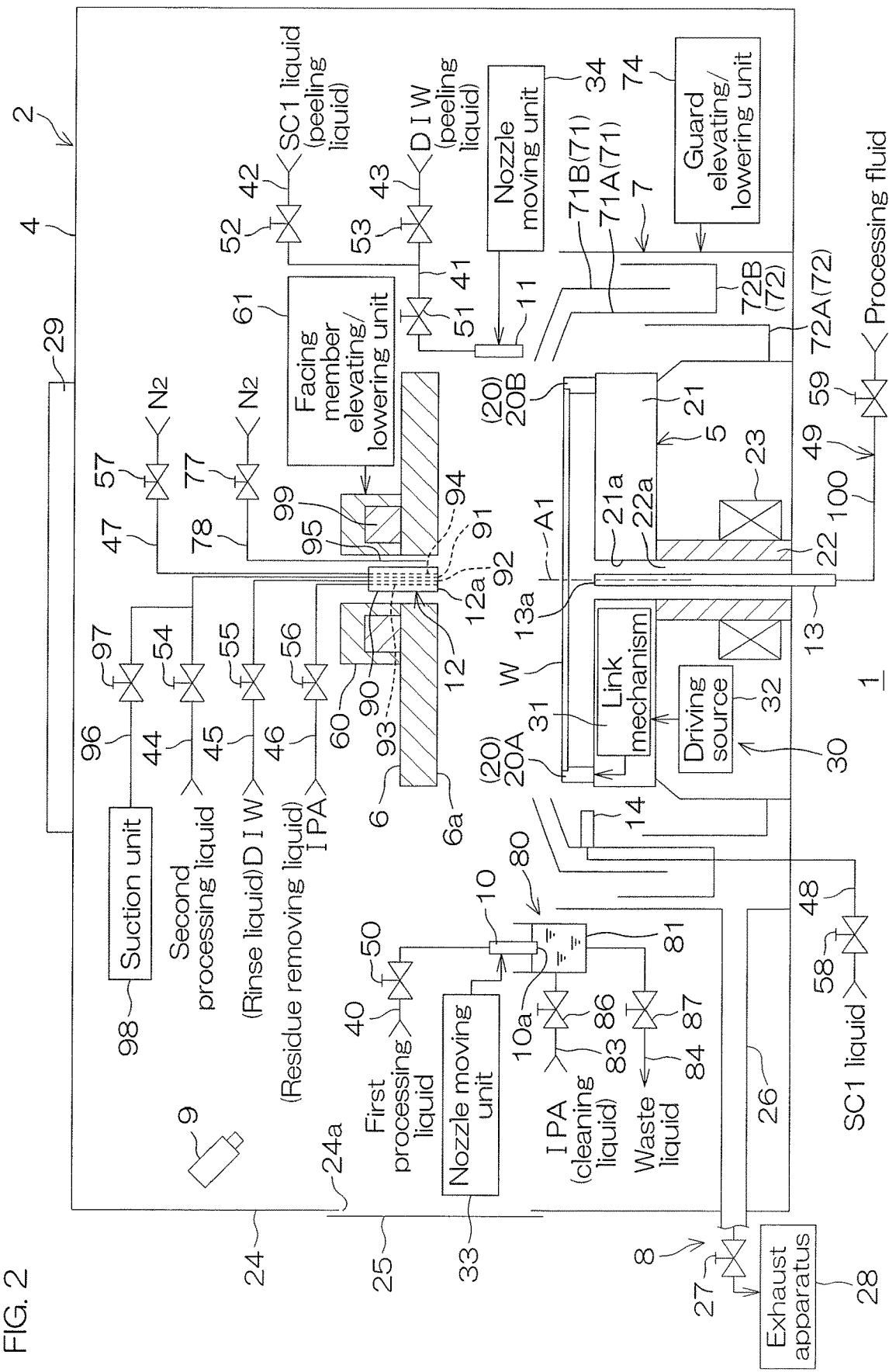
FIG. 2 is a schematic view of a processing unit included in the substrate processing apparatus.

FIG. 2 is a schematic view for describing an configuration example of a processing unit 2. The processing unit 2 includes a chamber 4, having an internal space, and a spin chuck 5, rotating a substrate W around a vertical rotational axis A1 passing through its central portion while holding the substrate W horizontally inside the chamber 4, a facing member 6, facing an upper surface of the substrate W held by the spin chuck 5, a cylindrical processing cup 7, receiving liquid splashing outward from the substrate W, an exhaust unit 8, exhausting an atmosphere inside the chamber 4, and an imaging unit 9, taking an image of a condition of the upper surface of the substrate W.

The chamber 4 includes a box-shaped partition wall 24, provided with a carry-in/carry-out port 24a, through which the substrate W passes, a shutter 25, opening and closing the carry-in/carry-out port 24a, and an FFU (fan filter unit) 29 as a blower unit feeding clean air from an upper portion of the partition wall 24 into an interior of the partition wall 24 (corresponding to an interior of the chamber 4). The clean air, which is air filtered by the FFU 29, is constantly supplied from the upper portion of the partition wall 24 into the interior of the chamber 4.

The spin chuck 5 is an example of a substrate holding unit that holds the substrate W horizontally. The substrate holding unit is also referred to as a substrate holder. The spin chuck 5 includes a chuck unit 20, a spin base 21, a rotating shaft 22, and an electric motor 23.

Figure 3A:
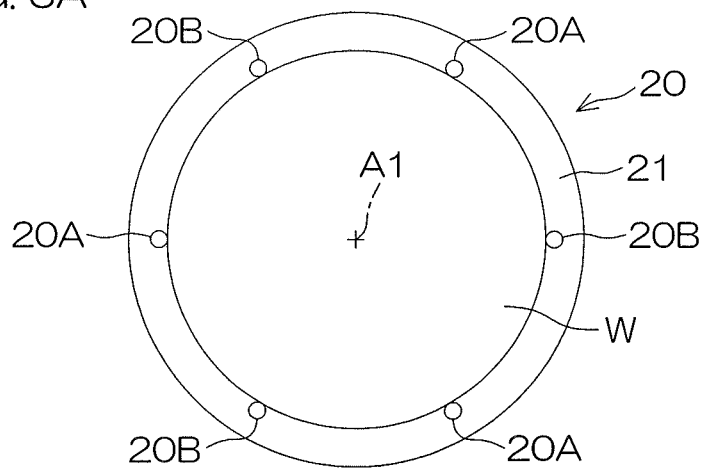
FIG. 3A is a plan view of a spin base and a chuck unit included in the processing unit and is a diagram for describing a closed state of the chuck unit.
Figure 3B:
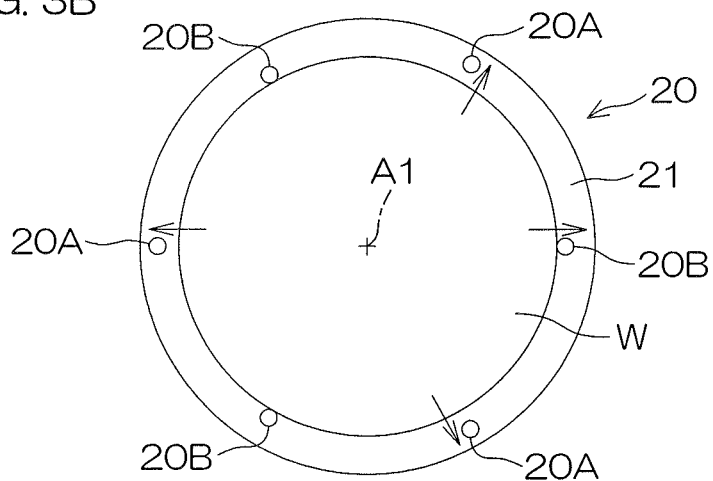
FIG. 3B is a plan view of the spin base and the chuck unit and is a diagram for describing a first separated state of the chuck unit.
Figure 3C:
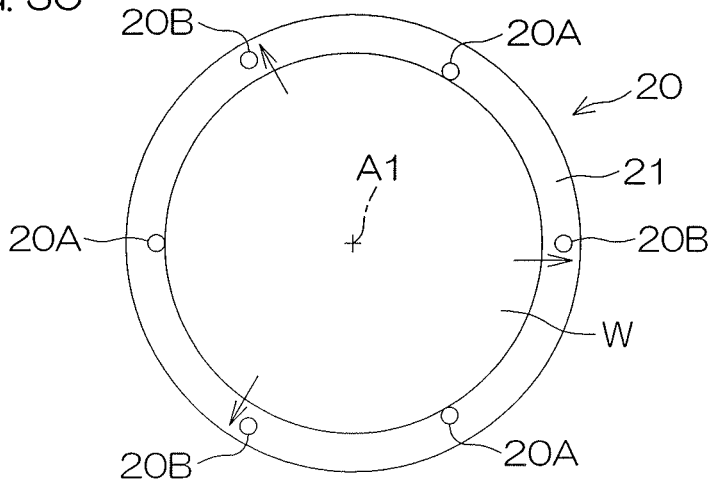
FIG. 3C is a plan view of the spin base and the chuck unit and is a diagram for describing a second separated state of the chuck unit.

FIG. 3A to FIG. 3C are plan views of the spin base 21 and the chuck unit 20. Referring to FIG. 3A, the spin base 21 has a disk shape oriented along a horizontal direction. The chuck unit 20 includes a plurality (for example, three) of first gripping pins 20A and a plurality (for example, three) of second gripping pins 20B disposed on an upper surface of the spin base 21. The first gripping pins 20A and the second gripping pins 20B are disposed alternately along a peripheral direction.

The chuck unit 20 is capable of changing among a closed state, an opened state, a first separated state, and a second separated state by the first gripping pins 20A and the second gripping pins 20B moving with respect to the substrate W.

The closed state is a state in which a peripheral edge of the substrate W is gripped by both the plurality of first gripping pins 20A and the plurality of second gripping pins 20B as shown in FIG. 3A. The first separated state is a state in which the peripheral edge of the substrate W is gripped by the plurality of second gripping pins 20B and the plurality of first gripping pins 20A are separated from the peripheral edge of the substrate W as shown in FIG. 3B. The second separated state is a state in which the peripheral edge of the substrate W is gripped by the plurality of first gripping pins 20A and the plurality of second gripping pins 20B are separated from the peripheral edge of the substrate W as shown in FIG. 3C.

Although not illustrated, a state in which the peripheral edge of the substrate W is not gripped by either of the first gripping pins 20A and the second gripping pins 20B is referred to as the opened state. When the state of each chuck unit 20 is the opened state, the transfer robot CR (see FIG. 1) can receive the substrates W from the plurality of chuck units 20.

Referring again to FIG. 2, each processing unit 2 further includes a pin driving unit 30 that drives the plurality of first gripping pins 20A and the plurality of second gripping pins 20B to open and close. The pin driving unit 30 includes, for example, a link mechanism 31, incorporated in the spin base 21, and a driving source 32, disposed outside the spin base 21. The driving source 32 includes, for example, a ball-screw mechanism and an electric motor applying a driving force thereto. The pin driving units 30 can change the states of plurality of chuck units 20 to any of the closed state, the opened state, the first separated state, and the second separated state by driving the plurality of first gripping pins 20A and the plurality of second gripping pins 20B.

Each rotating shaft 22 extends in a vertical direction along the rotational axis A1. An upper end portion of the rotating shaft 22 is coupled to a lower surface center of the spin base 21. A penetrating hole 21a, penetrating through the spin base 21 vertically, is formed in a central region of the spin base 21 in plan view. The penetrating hole 21a is in communication with an internal space 22a of the rotating shaft 22.

The electric motor 23 applies a rotating force to the rotating shaft 22. The spin base 21 is rotated by the rotating shaft 22 being rotated by the electric motor 23. The substrate W is thereby rotated around the rotational axis A1. In the following description, an inner side in a radial direction centered at the rotational axis A1 shall be referred to simply as the "radially inner side" and an outer side in the radial direction centered at the rotational axis A1 shall be referred to simply as the "radially outer side." The electric motor 23 is included in a substrate rotating unit that rotates the substrate W around the rotational axis A1.

The processing cup 7 includes a plurality of guards 71, receiving liquid splashing outward from the substrate W held by the spin chuck 5, a plurality of cups 72, receiving the liquid guided downward by the plurality of guards 71, and an outer wall member 73 of circular cylindrical shape that surrounds the plurality of guards 71 and the plurality of cups 72. With the present preferred embodiment, an example where two guards 71 (a first guard 71A and a second guard 71B) and two cups 72 (a first cup 72A and a second cup 72B) are provided is illustrated.

Each of the first cup 72A and the second cup 72B has an upwardly-open, groove-shaped form. The first guard 71A surrounds the spin base 21. The second guard 71B surrounds the spin base 21 at a further radially outer side than the first guard 71A. The first cup 72A receives the liquid guided downward by the first guard 71A. The second cup 72B is formed integral to the first guard 71A and receives the liquid guided downward by the second guard 71B.

The processing unit 2 includes a guard elevating/lowering unit 74 that elevates and lowers each of the first guard 71A and the second guard 71B separately. The guard elevating/lowering unit 74 elevates and lowers the first guard 71A between a lower position and an upper position. The guard elevating/lowering unit 74 elevates and lowers the second guard 71B between a lower position and an upper position. The first guard 71A is positioned laterally to the substrate W in an entirety of a movable range between the upper position and the lower position. The second guard 71B is positioned laterally to the substrate W in an entirety of a movable range between the upper position and the lower position. The upper position and the lower position are included in each movable range.

The guard elevating/lowering unit 74 includes, for example, a first ball-screw mechanism (not shown), mounted to the first guard 71A, a first motor (not shown), applying a driving force to the first ball screw, a second ball-screw mechanism (not shown), mounted to the second guard 71B, and a second motor (not shown), applying a driving force to the second ball screw. The guard elevating/lowering unit 74 is also referred to as a guard lifter.

The exhaust unit 8 includes an exhaust duct 26, connected to a bottom portion of the outer wall member 73 of the processing cup 7, and an exhaust valve 27, opening and closing the exhaust duct 26. A flow rate (exhaust flow rate) of a gas flowing through the exhaust duct 26 can be adjusted by adjusting an opening degree of the exhaust valve 27. The exhaust duct 26 is connected, for example, to an exhaust apparatus 28 that suctions the interior of the chamber 4. The exhaust apparatus 28 may be a portion of the substrate processing apparatus 1 or may be provided separately from the substrate processing apparatus 1. In a case where the exhaust apparatus 28 is a portion of the substrate processing apparatus 1, the exhaust apparatus 28 is, for example, a vacuum pump, etc. A gas inside the chamber 4 is emitted from the chamber 4 through the exhaust duct 26. A downflow of clean air is thereby formed constantly in the interior of the chamber 4.

The facing member 6 faces the substrate W, held by the spin chuck 5, from above. The facing member 6 is formed to a disk shape having substantially same diameter as or a diameter not less than that of the substrate W and is disposed substantially horizontally above the spin chuck 5. The facing member 6 has a facing surface 6a facing the upper surface of the substrate W.

A hollow shaft 60 is fixed to a surface of the facing member 6 at an opposite side to the facing surface 6a. A communicating hole, penetrating vertically through the facing member 6 and being in communication with an internal space of the hollow shaft 60, is formed in a portion of the facing member 6 including a position overlapping with the rotational axis A1 in plan view.

The facing member 6 blocks an atmosphere, inside a space between the facing surface 6a of the facing member 6 and the upper surface of the substrate W, from an atmosphere at an exterior of the space. The facing member 6 is thus also called a blocking plate.

The processing unit 2 further includes a facing member elevating/lowering unit 61 that drives elevation and lowering of the facing member 6. The facing member elevating/lowering unit 61 is capable of positioning the facing member 6 at any position (height) from a lower position to an upper position. The lower position is a position within the movable range of the facing member 6 at which the facing surface 6a of the facing member 6 is positioned most proximate to the substrate W. The upper position is a position within the movable range of the facing member 6 at which the facing surface 6a of the facing member 6 is separated furthest from the substrate W.

The facing member elevating/lowering unit 61 includes, for example, a ball-screw mechanism (not shown), mounted to a supporting member (not shown) supporting the hollow shaft 60, and an electric motor (not shown), applying a driving force thereto. The facing member elevating/lowering unit 61 is also referred to as a facing member lifter (a shielding plate lifter).

The imaging unit 9 is, for example, a CCD (charge coupled device) camera or CMOS (complementary metal oxide semiconductor) camera and is configured to be adjustable in exposure time and number of frames as parameters for imaging. The imaging unit 9 is mounted to the partition wall 24 of the chamber 4. The imaging unit 9 takes an image of the upper surface of the substrate W from an obliquely upward position.

The processing unit 2 includes a first moving nozzle 10, movable at least in a horizontal direction, a second moving nozzle 11, movable at least in a horizontal direction, a central nozzle 12, inserted through the hollow shaft 60 and facing a central region of the upper surface of the substrate W, a lower surface nozzle 13, inserted through the rotating shaft 22 and facing a central region of a lower surface of the substrate W, and a side nozzle 14, disposed at a side of the spin base 21.

The first moving nozzle 10 is an example of a processing liquid supplying unit that supplies (discharges) the first processing liquid toward the upper surface of the substrate W. The first processing liquid discharged from the first moving nozzle 10 contains a solute and a solvent having volatility. The first processing liquid solidifies or cures upon volatilization of at least a portion of the solvent to form a particle holding layer that pulls away particles, attached to the upper surface of the substrate W, from the substrate W and holds the particles.

Here, "solidification of the first processing liquid" refers, for example, to hardening of the solute due to forces acting between molecules or between atoms, etc., in accompaniment with the volatilization of the solvent. "Curing of the first processing liquid" refers, for example, to hardening of the solute due to a chemical change, such as polymerization, crosslinking, etc. "Solidifying or curing of the first processing liquid" thus expresses the "hardening" of the solute of the first processing liquid due to various causes.

A resin used as the solute of the first processing liquid is, for example, a resin (may hereinafter be referred to at times as the "thermosensitive water-soluble resin"), having properties of being poorly soluble or insoluble in water before being heated to not less than a predetermined alteration temperature and altering and becoming water soluble by being heated to not less than the alteration temperature.

The thermosensitive water-soluble resin expresses water solubility, for example, by decomposing and exposing a functional group with polarity upon being heated to the predetermined alteration temperature (for example, not less than 200° C.).

As the solvent of the first processing liquid, a solvent, having a dissolving ability with respect to the thermosensitive water-soluble resin before alteration and having volatility, may be used. Here, "having volatility" means being high in volatility in comparison to water. As the solvent of the first processing liquid, for example, PGEE (propylene glycol monoethyl ether) is used.

The first moving nozzle 10 is connected to a first processing liquid piping 40, in which a first processing liquid valve 50 is interposed. When the first processing liquid valve 50, interposed in the first processing liquid piping 40, is opened, the first processing liquid is discharged continuously downward from a discharge port 10a of the first moving nozzle 10.

The first moving nozzle 10 is moved in the horizontal direction and the vertical direction by a first nozzle moving unit 33. The first moving nozzle 10 is capable of moving between a central position and a home position (retracted position). When positioned at the central position, the first moving nozzle 10 faces a rotation center of the upper surface of the substrate W. The rotation center of the upper surface of the substrate W is a position of intersection of the rotational axis A1 in the upper surface of the substrate W. When positioned at the home position, the first moving nozzle 10 does not face the upper surface of the substrate W and is positioned outside the processing cup 7 in plan view.

When the facing member 6 is positioned at the upper position, the first moving nozzle 10 can enter between the facing surface 6a of the facing member 6 and the upper surface of the substrate W. By moving in the vertical direction, the first moving nozzle 10 can approach the upper surface of the substrate W or retract upward from the upper surface of the substrate W.

The first nozzle moving unit 33 includes, for example, a pivoting shaft (not shown), oriented along the vertical direction, an arm (not shown), coupled to the pivoting shaft and extending horizontally, and a pivoting shaft driving unit (not shown) that elevates, lowers, and pivots the pivoting shaft. The pivoting shaft driving unit pivots the pivoting shaft around a vertical pivoting axis to swing the arm. Further, the pivoting shaft driving unit elevates and lowers the pivoting shaft along the vertical direction to move the arm vertically. The first moving nozzle 10 is fixed to the arm. The first moving nozzle 10 moves in the horizontal direction and the vertical direction in accordance with the swinging and elevating/lowering of the arm.

The processing unit 2 includes a cleaning unit 80 arranged to clean the discharge port 10a of the first moving nozzle 10. The cleaning unit 80 includes a cleaning pot 81, storing a cleaning liquid, a cleaning liquid supply pipe 83, supplying the cleaning liquid to the cleaning pot 81, and a cleaning liquid drain pipe 84, draining the cleaning liquid from the cleaning pot 81. The cleaning liquid is, for example, IPA. By opening a cleaning liquid valve 86, interposed in the cleaning liquid supply pipe 83, the cleaning liquid is supplied to the cleaning pot 81. By opening a waste liquid valve 87, interposed in the cleaning liquid drain pipe 84, the cleaning liquid is drained from the cleaning pot 81.

The cleaning pot 81 is disposed below the first moving nozzle 10 positioned at the retracted position. The discharge port 10*a* of the first moving nozzle 10 is cleaned by downwardly moving the first moving nozzle 10, positioned at the retracted position, such that the discharge port 10*a* of the first moving nozzle 10 is positioned lower than a liquid surface of the cleaning liquid stored inside the cleaning pot 81 (for example, at a position shown in FIG. 2).

By opening the cleaning liquid valve 86 and the waste liquid valve 87 during the cleaning or after the cleaning of the discharge port 10*a* of the first moving nozzle 10, decrease of purity of the cleaning liquid inside the cleaning pot 81 can be suppressed or prevented. Attachment of particles to the first moving nozzle 10 from the cleaning liquid inside the cleaning pot 81 can thereby be suppressed or prevented.

The second moving nozzle 11 is an example of a peeling liquid supplying unit that supplies (discharges) the peeling liquids toward the upper surface of the substrate W. Each peeling liquid is a liquid for peeling the particle holding layer, formed by the first processing liquid, from the upper surface of the substrate W. A liquid having compatibility with the solvent contained in the first processing liquid is preferably used as the peeling liquid.

As the peeling liquid, for example, a water-based peeing liquid is used. As the water-based peeling liquid, the peeling liquid is not restricted to DIW, and carbonated water, electrolyzed ion water, hydrogen water, ozone water, as well as aqueous hydrochloric acid solution and aqueous alkaline solution of dilute concentrations (for example, approximately 10 ppm to 100 ppm), etc., can be cited. As the aqueous alkaline solution, SC1 solution (ammonia-hydrogen peroxide mixture), aqueous ammonia solution, aqueous solution of a quaternary ammonium hydroxide, such as tetramethylammonium hydroxide, etc., aqueous choline solution, etc., can be cited.

In the present preferred embodiment, the second moving nozzle 11 is connected to a common piping 41 with a common valve 51 interposed therein. A first SC1 liquid piping 42, with a first SC1 liquid valve 52 interposed therein, and a first DIW liquid piping 43, with a first DIW liquid valve 53 interposed therein, are connected to a portion of the common piping 41 at a further upstream side than the common valve 51. When the common valve 51 and the first SC1 liquid valve 52 are opened, the SC1 liquid is discharged continuously downward as the peeling liquid from a discharge port of the second moving nozzle 11. When the common valve 51 and the first DIW liquid valve 53 are opened, DIW is discharged continuously downward as the peeling liquid from the discharge port of the second moving nozzle 11.

DIW also functions as the rinse liquid that washes away a chemical liquid, such as the peeling liquid, etc., on the substrate W. The rinse liquid is, for example, DIW. Besides DIW, carbonated water, electrolyzed ion water, hydrogen water, ozone water, ammonia water, and aqueous hydrochloric acid solution of dilute concentration (for example, approximately 10 ppm to 100 ppm) can be cited as the rinse liquid. The second moving nozzle 11 can thus also function as a rinse liquid supplying unit that supplies the rinse liquid to the upper surface of the substrate W.

The second moving nozzle 11 is moved in the horizontal direction and the vertical direction by a second nozzle moving unit 34. The second moving nozzle 11 is capable of moving between a central position and a home position (retracted position). When positioned at the central position, the second moving nozzle 11 faces the rotation center of the upper surface of the substrate W. When positioned at the home position, the second moving nozzle 11 does not face the upper surface of the substrate W and is positioned outside the processing cup 7 in plan view.

When the facing member 6 is positioned at the upper position, the second moving nozzle 11 can enter between the facing surface 6*a* of the facing member 6 and the upper surface of the substrate W. By moving in the vertical direction, the second moving nozzle 11 can approach the upper surface of the substrate W or retract upward from the upper surface of the substrate W.

The second nozzle moving unit 34 has the same configuration as the first nozzle moving unit 33. That is, the second nozzle moving unit 34 includes, for example, a pivoting shaft (not shown), oriented along the vertical direction, an arm (not shown), coupled to the pivoting shaft and the second moving nozzle 11 and extending horizontally, and a pivoting shaft driving unit (not shown) that elevates, lowers, and pivots the pivoting shaft.

The central nozzle 12 includes a plurality of inner tubes (a first tube 91, a second tube 92, a third tube 93, and a fourth tube 94) that discharge processing liquids downward and a cylindrical casing 90, surrounding the plurality of inner tubes. The first tube 91, the second tube 92, the third tube 93, the fourth tube 94, and the casing 90 extend in an up/down direction along the rotational axis A1. An inner peripheral surface of the facing member 6 and an inner peripheral surface of the hollow shaft 60 surround an outer peripheral surface of the casing 90 across an interval in a rotational radius direction. A discharge port 12*a* of the central nozzle 12 is provided at the facing surface 6*a* of the facing member 6. The discharge port 12*a* of the central nozzle 12 is also a discharge port of the first tube 91, the second tube 92, the third tube 93, and the fourth tube 94.

The first tube 91 discharges the second processing liquid toward the upper surface of the substrate W. A second processing liquid supply piping 44, with a second processing liquid valve 54 interposed therein, is connected to the first tube 91. When the second processing liquid valve 54 is opened, the second processing liquid is supplied from the second processing liquid supply piping 44 to the first tube 91 and is discharged continuously downward from the discharge port of the first tube 91 (the discharge port 12*a* of the central nozzle 12). The central nozzle 12 is an example of a second processing liquid supplying unit that supplies the second processing liquid to the upper surface of the substrate W.

The second processing liquid is a liquid that contains a sublimable substance. As the liquid containing the sublimable substance, for example, that containing the sublimable substance in a molten state, such as a melt of the sublimable substance, etc., or a solution, in which the sublimable substance is dissolved as a solute in a solvent, etc., may be used. Here, "molten state" refers to a state where the sublimable substance has fluidity due to being molten completely or partially and assumes a liquid state. As the sublimable substance, any of various substances that is high in vapor pressure at an ordinary temperature (5° C. to 35° C.)

and changes from a solid phase to a gas phase without passing through a liquid phase is used.

With the present preferred embodiment, an example where 1,1,2,2,3,3,4-heptafluorocyclopentane is used as the sublimable substance shall be described. This compound has a vapor pressure at 20° C. of approximately 8266 Pa, a melting point (freezing point) of 20.5° C., and a boiling point of 82.5° C.

As the solvent in a case where the sublimable substance in the molten state is to be mixed, a solvent that exhibits compatibility with the sublimable substance in the molten state is preferable. Also, if the sublimable substance is to be dissolved as a solute, a solvent exhibiting a dissolving ability with respect to the sublimable substance is preferable.

As the solvent used in the second processing liquid, for example, at least one type of solvent selected from the group consisting of DIW, pure water, aliphatic hydrocarbons, aromatic hydrocarbons, esters, alcohols, ethers, etc., can be cited.

Specifically, for example, at least one type of solvent selected from the group consisting of DIW, pure water, methanol, ethanol, IPA, butanol, ethylene glycol, propylene glycol, NMP (N-methyl-2-pyrrolidone), DMF (N,N-dimethylformamide), DMA (dimethylacetamide), DMSO (dimethylsulfoxide), hexane, toluene, PGMEA (propylene glycol monomethyl ether acetate), PGME (propylene glycol monomethyl ether), PGPE (propylene glycol monopropyl ether), PGEE (propylene glycol monoethyl ether), GBL (γ-butyrolactone), acetylacetone, 3-pentanone, 2-heptanone, ethyl lactate, cyclohexanone, dibutyl ether, HFE (hydrofluoroether), ethyl nonafluoroisobutyl ether, ethyl nonafluorobutyl ether, and m-xylene hexafluoride, can be cited.

A suction piping 96 is branchingly connected to the second processing liquid piping 44 at a position further to the downstream side (first tube 91 side) than the second processing liquid valve 54. A suction valve 97, opening and closing a flow passage inside the suction piping 96, is interposed in the suction piping 96. A suction unit 98, arranged to suction the second processing liquid inside the first tube 91 and the second processing liquid piping 44 is connected to the suction piping 96. The suction unit 98 is, for example, a vacuum pump. Although in FIG. 2, the suction unit 98 is disposed in the chamber 4, it may be disposed outside the chamber 4 instead.

The processing unit 2 includes a heater 99 that heats the second processing liquid inside the first tube 91 and the second processing liquid piping 44 to keep a temperature of the second processing liquid inside the first tube 91 and the second processing liquid piping 44 at not less than the melting point of the sublimable substance. The heater 99 is, for example, incorporated in the hollow shaft 60.

The second tube 92 discharges DIW toward the upper surface of the substrate W. A second DIW piping 45, with a second DIW valve 55 interposed therein, is connected to the second tube 92. When the second DIW valve 55 is opened, DIW is supplied from the second DIW piping 45 to the second tube 92 and is discharged continuously downward from the discharge port of the second tube 92 (the discharge port 12a of the central nozzle 12). The central nozzle 12 is an example of the rinse liquid supplying unit that supplies the rinse liquid to the upper surface of the substrate W. As mentioned above, DIW also functions as the peeling liquid and therefore the central nozzle 12 is also capable of functioning as the peeling liquid supplying unit that supplies (discharges) the peeling liquid toward the upper surface of the substrate W.

The third tube 93 discharges IPA toward the upper surface of the substrate W. An IPA piping 46, with an IPA valve 56 interposed therein, is connected to the third tube 93. When the IPA valve 56 is opened, IPA is supplied from the IPA piping 46 to the third tube 93 and is discharged continuously downward from the discharge port of the third tube 93 (the discharge port 12a of the central nozzle 12).

IPA is an example of the residue removing liquid having a dissolving ability with respect to the solute of the first processing liquid. The central nozzle 12 is thus an example of a residue removing liquid supplying unit that supplies the residue removing liquid to the upper surface of the substrate W.

When a thermosensitive water-soluble resin is used as the solute of the first processing liquid, a liquid having a dissolving ability with respect to the thermosensitive water-soluble resin before alteration may be used as the residue removing liquid. An example of the liquid used as the residue removing liquid when a thermosensitive water-soluble resin is used as the solute of the first processing liquid is IPA. The residue removing liquid is preferably a liquid having compatibility with the water-based peeling liquid.

The fourth tube 94 discharges the gas, such as nitrogen gas, etc., toward the upper surface of the substrate W. A first gas piping 47, with a first gas valve 57 interposed therein, is connected to the fourth tube 94. When the first gas valve 57 is opened, the gas is supplied from the first gas piping 47 to the fourth tube 94 and is discharged continuously downward from the discharge port of the fourth tube 94 (the discharge port 12a of the central nozzle 12). The central nozzle 12 is an example of a gas supplying unit that supplies the gas to the upper surface of the substrate W.

The gas discharged from the fourth tube 94 is preferably an inert gas. The inert gas refers to a gas that is inert with respect to the upper surface and a pattern of the substrate W and may, for example, be a noble gas, such as argon, etc. The gas discharged from the fourth tube 94 may be air.

A fifth tube 95 is disposed between the casing 90 of the central nozzle 12 and the inner peripheral surface of the facing member 6 and between the casing 90 and an inner peripheral surface of the hollow shaft 60. The fifth tube 95 discharges a gas, such as nitrogen gas, etc., downward. A second gas piping 78, with a second gas valve 77 interposed therein, is connected to the fifth tube 95. When the second gas valve 77 is opened, the gas is supplied from the second gas piping 78 to the fifth tube 95 and is discharged continuously downward from a discharge port of the fifth tube 95. The fifth tube 95 is an example of an atmosphere replacing unit that supplies the gas to the space between the upper surface of the substrate W and the facing surface 6a of the facing member 6 to replace the atmosphere between the upper surface of the substrate W and the facing surface 6a of the facing member 6.

The gas discharged from the fifth tube 95 is preferably an inert gas. The inert gas refers to a gas that is inert with respect to the upper surface and the pattern of the substrate W and may, for example, be a noble gas, such as argon, etc. The gas discharged from the fifth tube 95 may be air.

The side nozzle 14 is fixed to the first guard 71A. The side nozzle 14 is connected to a second SC1 liquid piping 48 with a second SC1 liquid valve 58 interposed therein. When the second SC1 liquid valve 58 is opened, the SC1 liquid is continuously discharged laterally from a discharge port of the side nozzle 14. When the first guard 71A is positioned at a predetermined cleaning position, the side nozzle 14 faces the chuck unit 20 laterally. The first gripping pins 20A and the second gripping pins 20B are cleaned by the SC1 liquid being discharged from the discharge port of the side nozzle 14 in a state where the first guard 71A is positioned at the predetermined cleaning position and the spin base 21 is rotating.

The lower surface nozzle 13 is inserted in the penetrating hole 21a opening at a central portion of the upper surface of the spin base 21. A discharge port 13a of the lower surface nozzle 13 is exposed from the upper surface of the spin base 21. The discharge port 13a of the lower surface nozzle 13 faces a central portion of the lower surface of the substrate W from below.

The processing unit 2 includes a processing fluid supply piping 49 supplying a plurality of types of processing fluids to the lower surface nozzle 13. FIG. 4 is a schematic view of the processing fluid supply piping 49.

The processing fluids discharged from the discharge port 13a of the lower surface nozzle 13 are, for example, a peeling liquid and the heat medium. Each heat medium is a fluid for transmitting heat to the substrate W. DIW can be cited as an example of the heat medium. The heat medium is not restricted to a liquid and may be a gas. The processing fluid supply piping 49 is capable of supplying the heat medium to the lower surface 13 and is therefore also called a heat medium supply piping.

The processing fluid supply piping 49 includes a processing fluid feeding piping 100, a processing fluid common piping 101, a high temperature DIW feeding piping 102, a low temperature DIW feeding piping 103, a medium temperature DIW feeding piping 104, an $H_2O_2$ feeding piping 105, and an ammonia water feeding piping 106.

The processing fluid feeding piping 100 feeds the processing fluid from the processing fluid common piping 101 to the discharge port 13a of the lower surface nozzle 13. The high temperature DIW feeding piping 102 feeds high temperature DIW from a high temperature DIW supply source 112 to the processing fluid common piping 101. The low temperature DIW feeding piping 103 feeds low temperature DIW from a low temperature DIW supply source 113 to the processing fluid common piping 101. The medium temperature DIW feeding piping 104 feeds medium temperature DIW from a medium temperature DIW supply source 114 to the processing fluid common piping 101. The $H_2O_2$ feeding piping 105 feeds hydrogen peroxide solution ($H_2O_2$) from an $H_2O_2$ supply source 115 to the processing fluid common piping 101. The ammonia water feeding piping 106 feeds ammonia water from an ammonia water supply source 116 to the processing fluid common piping 101.

By two or more types of processing fluids being fed to the processing fluid common piping 101 at the same time, the processing fluids are mixed with each other. By hydrogen peroxide solution, ammonia water, and DIW being fed to the processing fluid common piping 101, the SC1 liquid is prepared.

A liquid draw-off piping 107, draining the processing fluid inside the processing fluid common piping 101, is connected to the processing fluid common piping 101.

A processing fluid valve 59, opening and closing a flow passage inside the processing fluid feeding piping 100, is interposed in the processing fluid feeding piping 100. A high temperature DIW valve 122, opening and closing a flow passage inside the high temperature DIW feeding piping 102, is interposed in the high temperature DIW feeding piping 102. A low temperature DIW valve 123, opening and closing a flow passage inside the low temperature DIW feeding piping 103, is interposed in the low temperature DIW feeding piping 103. A medium temperature DIW valve 124, opening and closing a flow passage inside the medium temperature DIW feeding piping 104, is interposed in the medium temperature DIW feeding piping 104. An $H_2O_2$ valve 125, opening and closing a flow passage inside the $H_2O_2$ feeding piping 105, is interposed in the $H_2O_2$ feeding piping 105. An ammonia water valve 126, opening and closing a flow passage inside the ammonia water feeding piping 106, is interposed in the ammonia water feeding piping 106. A liquid draw-off valve 127, opening and closing a flow passage inside the liquid draw-off piping 107, is interposed in the liquid draw-off piping 107.

A temperature of the DIW (high temperature DIW) supplied from the high temperature DIW supply source 112 is, for example, 60° C. to 80° C. The high temperature DIW functions as a first heat medium that heats the substrate W. A temperature of the DIW (low temperature DIW) supplied from the low temperature DIW supply source 113 is, for example, 4° C. to 19° C. The low temperature DIW functions as a second heat medium that cools the substrate W. A temperature of the DIW (medium temperature DIW) supplied from the medium temperature DIW supply source 114 is, for example, 25° C. The medium temperature DIW functions as a third heat medium for holding the temperature within a temperature range of not less than the melting point (20.5° C.) of the sublimable substance and less than the boiling point (82.5° C.) of the sublimable substance.

When the high temperature DIW valve 122 and the processing fluid valve 59 are opened, the high temperature DIW (first heat medium) is discharged from the lower surface nozzle 13 toward the lower surface of the substrate W via the high temperature DIW feeding piping 102, the processing fluid common piping 101, and the processing fluid feeding piping 100. The lower surface nozzle 13 functions as a first heat medium supplying unit that supplies the first heat medium to the lower surface of the substrate W.

When the low temperature DIW valve 123 and the processing fluid valve 59 are opened, the low temperature DIW (second heat medium) is discharged from the lower surface nozzle 13 toward the lower surface of the substrate W via the low temperature DIW feeding piping 103, the processing fluid common piping 101, and the processing fluid feeding piping 100. The lower surface nozzle 13 thus also functions as a second heat medium supplying unit.

When the medium temperature DIW valve 124 and the processing fluid valve 59 are opened, the medium temperature DIW (third heat medium) is discharged from the lower surface nozzle 13 toward the lower surface of the substrate W via the medium temperature DIW feeding piping 104, the processing fluid common piping 101, and the processing fluid feeding piping 100. The lower surface nozzle 13 thus also functions as a third heat medium supplying unit.

Figure 5:
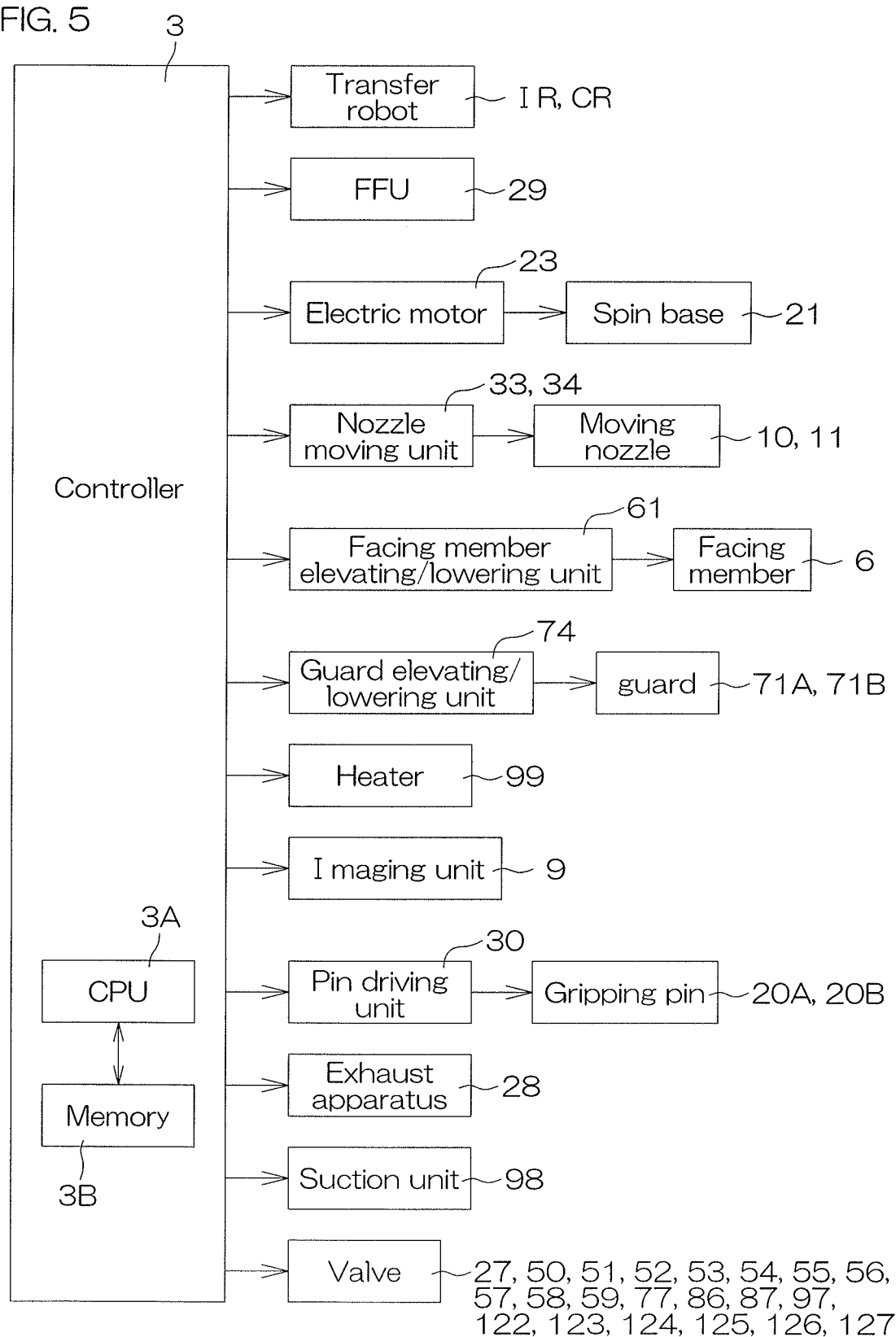
FIG. 5 is a block diagram for describing the electrical configuration of a main portion of the substrate processing apparatus.

FIG. 5 is a block diagram for describing the electrical configuration of a main portion of the substrate processing apparatus 1. The controller 3 includes a microcomputer and controls control objects included in the substrate processing apparatus 1 in accordance with a predetermined program. More specifically, the controller 3 includes a processor (CPU) 3A and a memory 3B, storing the program, and is arranged such that various controls for substrate processing are executed by the processor 3A executing the program.

In particular, the controller 3 controls operations of the transfer robot IR, the transfer robot CR, the FFU 29, the electric motor 23, the first nozzle moving unit 33, the second nozzle moving unit 34, the facing member elevating/lowering unit 61, the guard elevating/lowering unit 74, the heater 99, the imaging unit 9, the pin driving unit 30, the exhaust apparatus 28, the suction unit 98, and the exhaust valve 27, the first processing liquid valve 50, the common valve 51, the first SC1 liquid valve 52, the first DIW valve 53, the second processing liquid valve 54, the second DIW valve 55, the IPA valve 56, the first gas valve 57, the second SC2 liquid valve 58, the processing fluid valve 59, the second gas valve 77, the cleaning liquid valve 86, the waste liquid valve 87, the suction valve 97, the high temperature DIW valve 122, the low temperature DIW valve 123, the medium temperature DIW valve 124, the $H_2O_2$ valve 125, the ammonia water valve 126, and the liquid draw-off valve 127. By controlling the exhaust valve 27, the first processing liquid valve 50, the common valve 51, the first SC1 liquid valve 52, the first DIW valve 53, the second processing liquid valve 54, the second DIW valve 55, the IPA valve 56, the first gas valve 57, the second SC2 liquid valve 58, the processing fluid valve 59, the second gas valve 77, the cleaning liquid valve 86, the waste liquid valve 87, the suction valve 97, the high temperature DIW valve 122, the low temperature DIW valve 123, the medium temperature DIW valve 124, the $H_2O_2$ valve 125, the ammonia water valve 126, and the liquid draw-off valve 127, control of whether or not fluids are discharged from the corresponding nozzles and tubes, etc., is performed.

Figure 6:
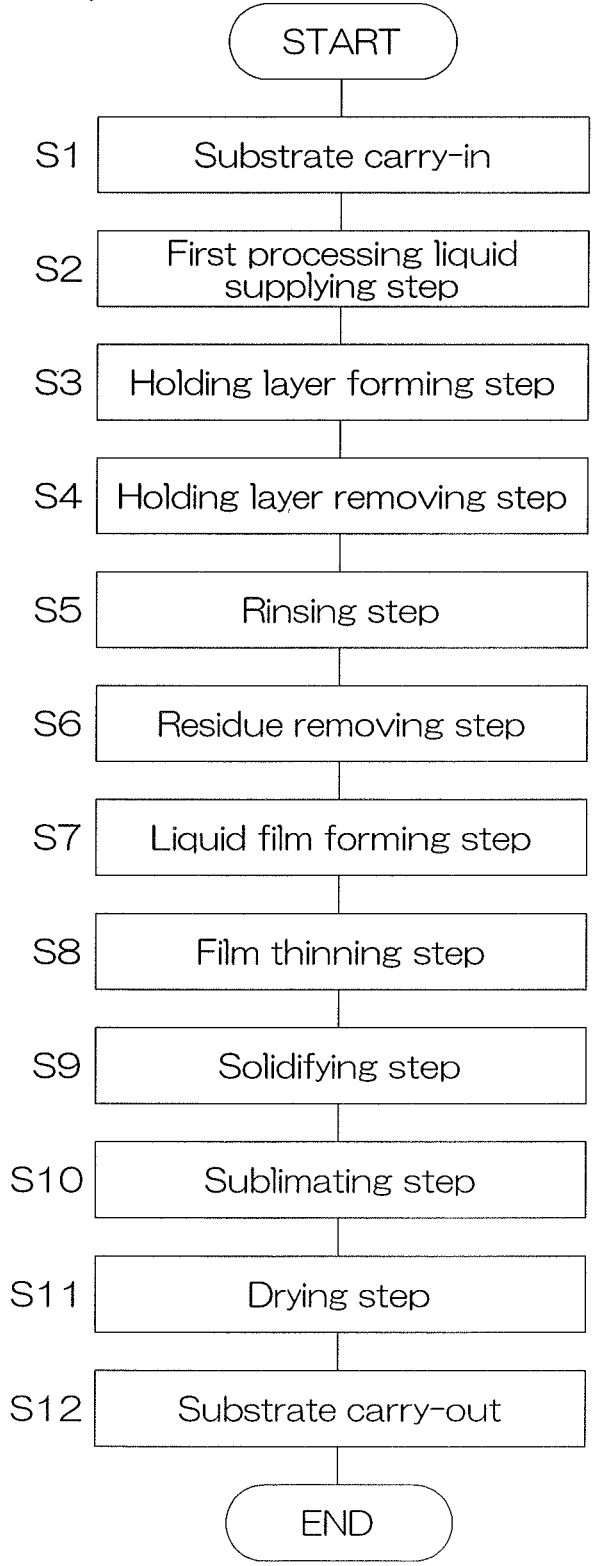
FIG. 6 is a flowchart for describing an example of substrate processing by the substrate processing apparatus.

FIG. 6 is a flowchart for describing an example of substrate processing by the substrate processing apparatus 1 and mainly shows processing realized by the controller 3 executing the program. FIG. 7A to FIG. 7L are illustrative sectional views for describing the substrate processing.

In the substrate processing by the substrate processing apparatus 1, for example, substrate carry-in (S1), a first processing liquid supplying step (S2), a holding layer forming step (S3), a holding layer removing step (S4), a rinsing step (S5), a residue removing step (S6), a liquid film forming step (S7), a film thinning step (S8), a solidifying step (S9), a sublimating step (S10), a drying step (S11), and substrate carry-out (S12) are executed in that order as shown in FIG. 6.

First, an unprocessed substrate W is carried from a carrier C into a processing unit 2 by the transfer robot IR and the transfer robot CR (see FIG. 1) and transferred to the spin chuck 5 (S1). The chuck unit 20 is then put in the closed state. The substrate W is thereby held horizontally by the spin chuck 5 (substrate holding step). The holding of the substrate W by the spin chuck 5 is continued until the drying step (S11) ends. At this point, the substrate W is gripped by both the plurality of first gripping pins 20A and the plurality of second gripping pins 20B (first substrate gripping step). Also, the facing member elevating/lowering unit 61 disposes the facing member 6 at the upper position.

Figure 7A:
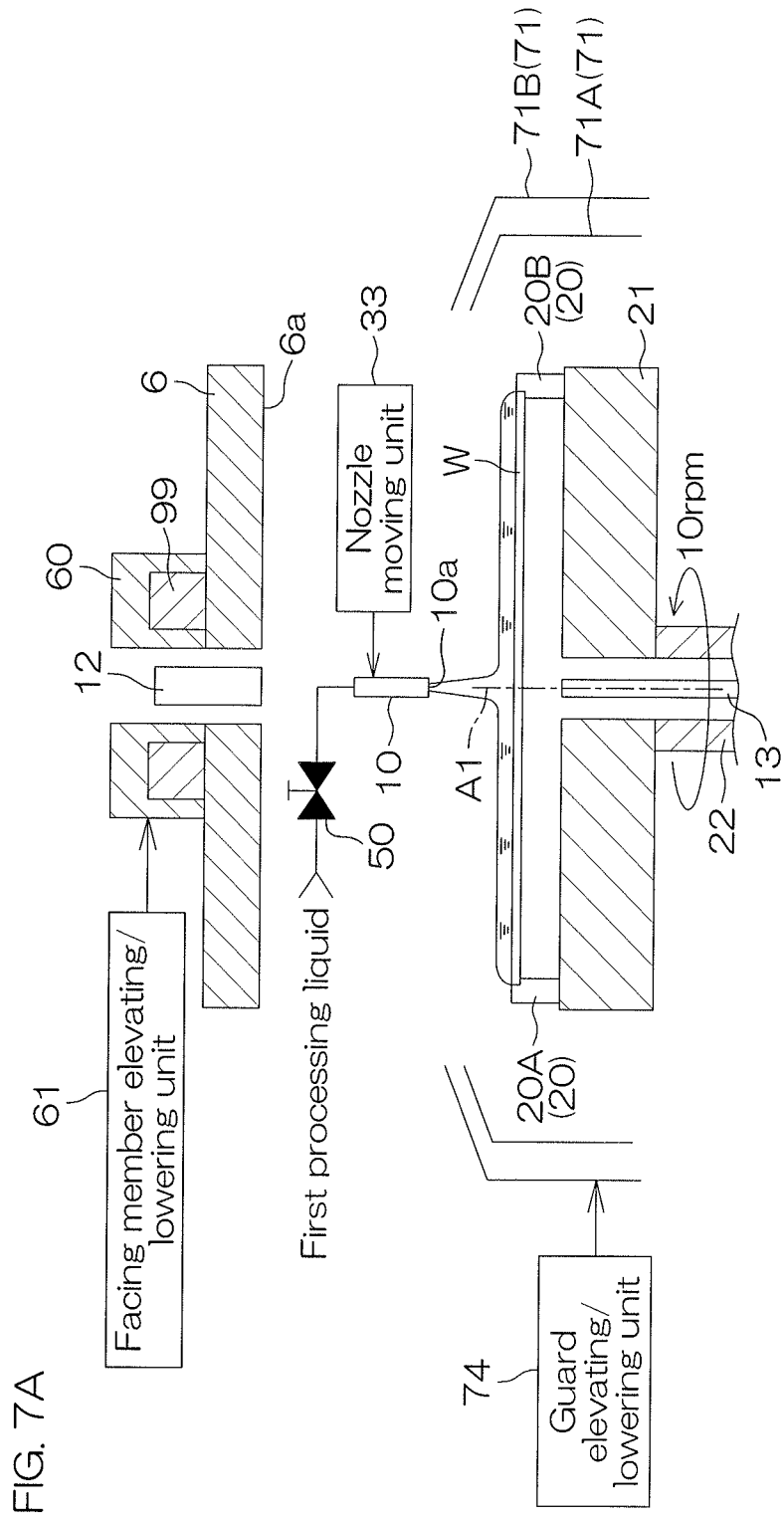

Next, referring to FIG. 7A, the first processing liquid supplying step of supplying the first processing liquid to the upper surface of the substrate W is executed (S2). The first processing liquid supplying step is executed in a period, for example, of 2.4 seconds. In the first processing liquid supplying step, first, the electric motor 23 (see FIG. 2) rotates the spin base 21. The substrate W is thereby rotated (substrate rotating step). In the first processing liquid supplying step, the spin base 21 is rotated at a predetermined first processing liquid supplying speed. The first processing liquid supplying speed is, for example, 10 rpm. The guard elevating/lowering unit 74 disposes both the first guard 71A and the second guard 71B at the upper position (guard disposing step).

The first nozzle moving unit 33 then disposes the first moving nozzle 10 at the central position. The first processing liquid valve 50 is then opened. The first processing liquid is thereby supplied from the first moving nozzle 10 toward the upper surface of the substrate W in the rotating state. The first processing liquid supplied to the upper surface of the substrate W spreads across the entire upper surface of the substrate W due to a centrifugal force. Excess first processing liquid is eliminated radially outward from the substrate W due to the centrifugal force. The first processing liquid eliminated from the substrate W is received by the first guard 71A.

Figure 7C:
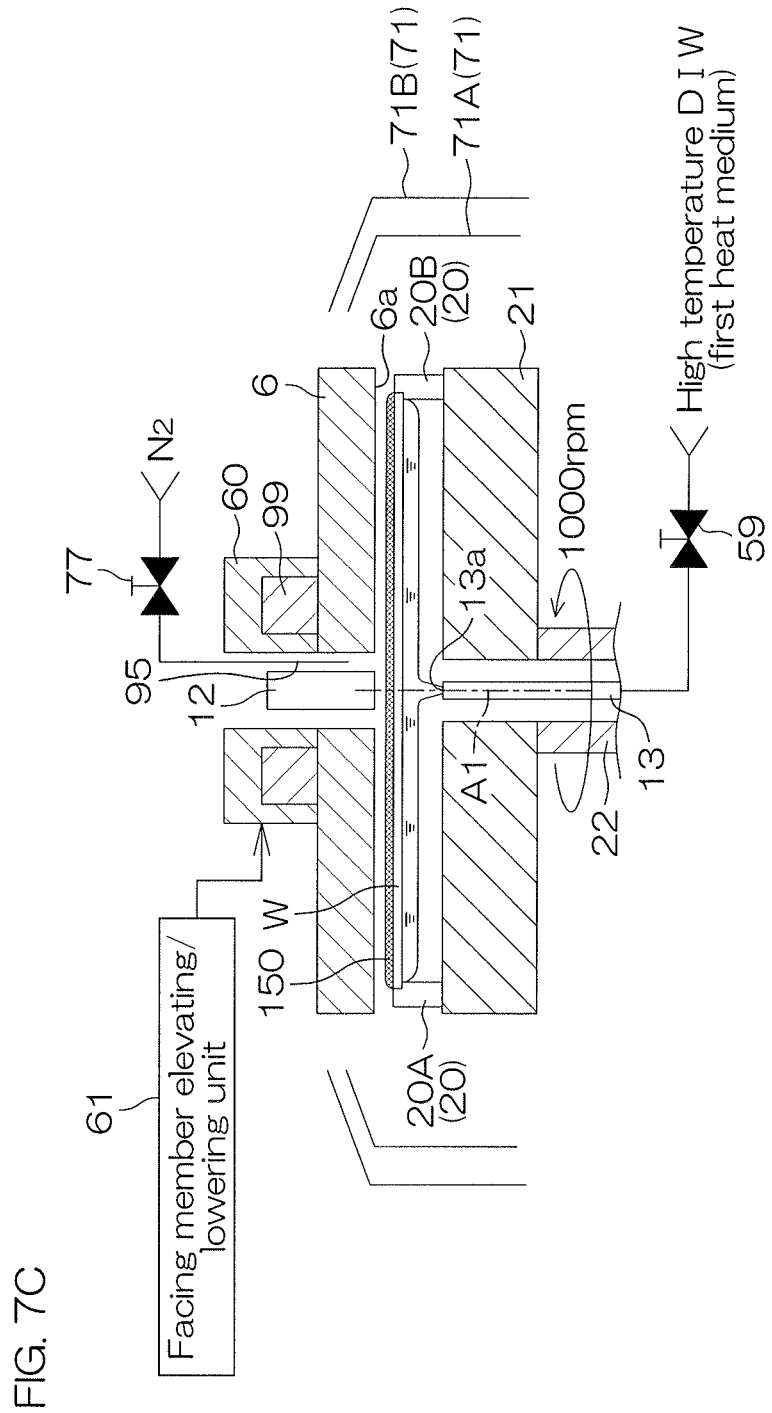

Referring to FIG. 7B and FIG. 7C, after the first processing liquid is supplied to the substrate W for a fixed time, the holding layer forming step of solidifying or curing the first processing liquid to form a particle holding layer 150 (see FIG. 7C) on the upper surface of the substrate W is executed (S3).

As shown in FIG. 7B, first, in the holding layer forming step, the first processing liquid valve 50 is closed to make an amount of the first processing liquid on the substrate W an appropriate amount. The discharge (supply) of the first processing liquid from the discharge port 10a of the first moving nozzle 10 to the upper surface of the substrate W is thereby stopped (supply stopping step). The first moving nozzle 10 is then moved to the retracted position by the first nozzle moving unit 33. A rotation elimination step of eliminating a portion of the first processing liquid from the upper surface of the substrate W by a centrifugal force is then executed.

In the rotation elimination step, the electric motor 23 changes a rotational speed of the spin base 21 to a predetermined rotation elimination speed. The rotation elimination speed is, for example, 300 rpm to 1500 rpm. The rotational speed of the spin base 21 may be kept fixed within a range of 300 rpm to 1500 rpm or may be changed as appropriate within the range of 300 rpm to 1500 rpm in the middle of the rotation elimination step. The rotation elimination step is executed in a period, for example, of 30 seconds.

Then, referring to FIG. 7C, in the holding layer forming step, after the rotation elimination step, a substrate heating step of heating the substrate W to volatilize a portion of the solvent of the first processing liquid on the substrate W is executed. In the substrate heating step, the processing fluid valve 59 and the high temperature DIW valve 122 (see FIG. 4) are opened. The high temperature DIW (first heat medium) is thereby supplied from the lower surface nozzle 13 to the central region of the lower surface of the substrate W and the first processing liquid on the substrate W is heated via the substrate W. The substrate heating step is executed in a period, for example, of 60 seconds. In the substrate heating step, the electric motor 23 changes the rotational speed of the spin base 21 to a predetermined substrate heating speed. The substrate heating speed is, for example, 1000 rpm.

In the substrate heating step, the substrate W is preferably heated such that a temperature of the first processing liquid on the substrate W becomes less than a boiling point of the solvent. As described above, the solvent can be made to remain in the particle holding layer 150 by heating the first processing liquid to a temperature less than the boiling point of the solvent. The particle holding layer 150 can then be made easily peelable from the upper surface of the substrate W by interaction of the solvent remaining in the particle holding layer 150 and the peeling liquid.

In the substrate heating step, the substrate W is preferably heated such that the temperature of the first processing liquid on the substrate W becomes less than the alteration temperature of the thermosensitive water-soluble resin in addition to the temperature of the first processing liquid on the substrate W becoming less than the boiling point of the solvent. By heating the first processing liquid to a temperature less than the alteration temperature, the particle holding layer 150 that is poorly soluble or insoluble in the water-based peeling liquid can be formed on the upper surface of the substrate W without altering the thermosensitive water-soluble resin to be water-soluble.

Figure 8A:
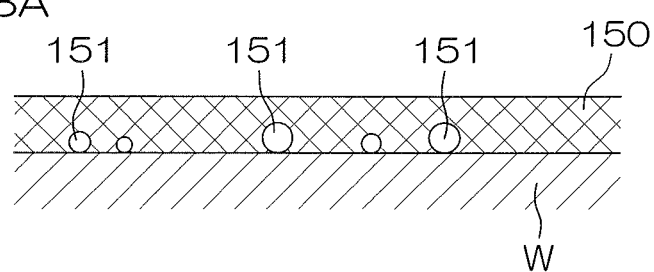
FIG. 8A and FIG. 8B are illustrative sectional views for describing conditions of a particle holding layer in the substrate processing.

By execution of the substrate heating step, the first processing liquid is solidified or cured and the particle holding layer 150 is formed on the substrate W. As shown in FIG. 8A, when the particle holding layer 150 is formed, particles 151 attached to the upper surface of the substrate W are pulled away from the substrate W and become held inside the particle holding layer 150.

The first processing liquid may be solidified or cured to a degree such as to be capable of holding the particles 151. It is not necessary for the solvent of the first processing liquid to be volatilized completely. Also, a "solute component" forming the particle holding layer 150 may be the solute, contained in the first processing liquid, itself or may be a component that is derived from the solute, for example, a component that is obtained as a result of a chemical change.

In the substrate heating step, the facing member elevating/lowering unit 61 disposes the facing member 6 at a first proximity position (proximity position) (proximity disposing step). When the facing member 6 is positioned at the first proximity position, the facing member 6 is positioned just a predetermined distance (for example, 1 mm) above the upper surface of the substrate W. The second gas valve 77 is then opened. The gas, such as nitrogen gas, etc., is thereby supplied from the fifth tube 95 to the space between the upper surface of the substrate W and the facing surface 6a. The gas supplied to the space between the facing surface 6a of the facing member 6 and the upper surface of the substrate W forms a gas stream moving from the central region of the upper surface of the substrate W toward a peripheral edge of the upper surface of the substrate W. The second gas valve 77 may be maintained open as it is until the drying step (S11) ends.

After spreading across substantially the entire lower surface of the substrate W, the high temperature DIW supplied to the lower surface of the substrate W splashes outside the substrate W due to the centrifugal force. The high temperature DIW that splashed outside the substrate W is received by the first guard 71A. A portion of the high temperature DIW received by the first guard 71A splashes back from the first guard 71A.

Thus, in the present preferred embodiment, the substrate heating step is executed in a state where the facing member 6 is disposed at the first proximity position. The facing member 6 protects the upper surface of the substrate W from the DIW (first heat medium) splashed back from the first guard 71A. Attachment of DIW to a front surface of the particle holding layer 150 can thus be suppressed and particles resulting from the splashing back of DIW from the first guard 71A can thus be suppressed.

Further, by forming the gas stream moving from the central region of the upper surface of the substrate W to the peripheral edge of the upper surface of the substrate W as in the present preferred embodiment, the high temperature DIW splashed back from the first guard 71A can be pushed back toward the first guard 71A. The attachment of high temperature DIW to the front surface of the particle holding layer 150 can thus be suppressed further.

As shown in FIG. 7D and FIG. 7E, after the holding layer forming step, the holding layer removing step of supplying the peeling liquids to the upper surface of the substrate W to peel and remove the particle holding layer 150 from the upper surface of the substrate W is executed (S4). In the holding layer removing step, a first peeling liquid supplying step, in which DIW is supplied as a first peeling liquid to the upper surface of the substrate W, and a second peeling liquid supplying step, in which the SC1 liquid is supplied as a second peeling liquid, are executed. Each of the first peeling liquid supplying step and the second peeling liquid supplying step is continued, for example, for 60 seconds.

Referring to FIG. 7D, in the first peeling liquid supplying step, the facing member elevating/lowering unit 61 disposes the facing member 6 at the upper position. The electric motor 23 then changes the rotational speed of the spin base 21 to a predetermined first peeling liquid speed. The first peeling liquid speed is, for example, 800 rpm. The high temperature DIW valve 122 is then closed and the medium temperature DIW valve 124 is opened (see also FIG. 4). The medium temperature DIW is thereby supplied to the lower surface of the substrate W in place of the high temperature DIW (first heat medium). The temperature of the substrate W is thereby made to approach the temperature of the medium temperature DIW (for example, 25° C.).

The second nozzle moving unit 34 then disposes the second moving nozzle 11 at the central position. The common valve 51 and the first DIW valve 53 are then opened. DIW is thereby supplied from the second moving nozzle 11 toward the upper surface of the substrate W (front surface of the particle holding layer 150) in the rotating state. The DIW supplied to the upper surface of the substrate W spreads across the entire upper surface of the substrate W due to the centrifugal force and replaces the first processing liquid.

The DIWs supplied to the upper surface and the lower surface of the substrate W are eliminated radially outward from the substrate W due to the centrifugal force. The DIWs and the first processing liquid eliminated from the substrate W are received by the first guard 71A.

Referring to FIG. 7E, in the second peeling liquid supplying step, the electric motor 23 changes the rotational speed of the spin base 21 to a predetermined second peeling liquid speed. The second peeling liquid speed is, for example, 800 rpm. In this case, a rotational speed of the substrate W in the first peeling liquid supplying step is maintained in the second peeling liquid supplying step. The first DIW valve 53 is then closed and, on the other hand, the first SC1 liquid valve 52 is opened. The SC1 liquid is thereby supplied from the second moving nozzle 11 toward the upper surface of the substrate W in the rotating state. Then, while maintaining the state in which the medium temperature DIW valve 124 (see FIG. 4) is opened, the $H_2O_2$ valve 125 (see FIG. 4) and the ammonia water valve 126 (see FIG. 4) are opened. The SC1 liquid is thereby supplied from the lower surface nozzle 13 toward the lower surface of the substrate W in the rotating state.

The SC1 liquid supplied to the upper surface of the substrate W spreads across the entire upper surface of the substrate W due to the centrifugal force and replaces the DIW on the substrate W. The SC1 liquids supplied to the upper surface and the lower surface of the substrate W are eliminated radially outward from the substrate W due to the centrifugal force. The DIW and the SC1 liquids eliminated from the substrate W are received by the first guard 71A.

Figure 8B:
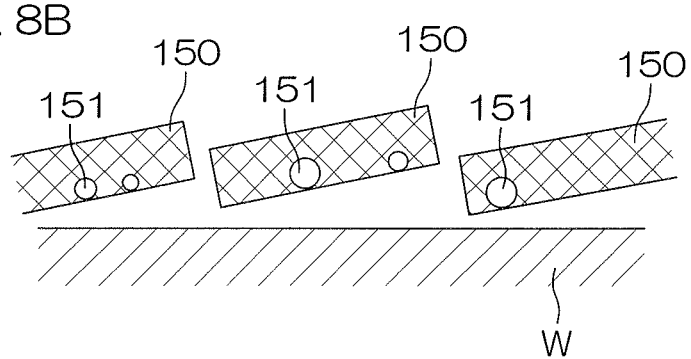

DIW and the SC1 liquid both have compatibility with PGEE, which is the solvent. Moreover, the particle holding layer 150, formed by heating the thermosensitive water-soluble resin to less than its alteration temperature, is, as mentioned above, poorly soluble or insoluble in DIW and the SC1 liquid, which are water-based peeling liquids. Thus, due to interactions with the PGEE remaining inside the particle holding layer 150, these peeling liquids permeate into the particle holding layer 150 without dissolving the solute component forming the particle holding layer 150. The peeling liquids then reach an interface with the substrate W. The particle holding layer 150 is thereby lifted and peeled, while still holding the particles 151, from the upper surface of the substrate W as shown in FIG. 8B.

The particle holding layer 150 peeled from the upper surface of the substrate W is expelled, together with the peeling liquids, from the peripheral edge of the upper surface of the substrate W by an action of the centrifugal force due to the rotation of the substrate W. That is, the peeled particle holding layer 150 is removed from the upper surface of the substrate W.

DIW is lower in effect as a peeling liquid than the SC1 liquid. However, DIW is supplied before the SC1 liquid and permeates into the particle holding layer 150 to replace at least a portion of the PGEE remaining inside the particle holding layer 150. The DIW then acts to aid the permeation of the SC1 liquid, supplied in the second peeling liquid supplying step, into the particle holding layer 150.

Although, as the peeling liquid, it is thus preferable to supply DIW before supplying the SC1 liquid, the supply of DIW (first peeling liquid supplying step) may be omitted. That is, just the SC1 liquid may be used as the peeling liquid.

Referring to FIG. 7F, after the holding layer removing step, the rinsing step of replacing the peeling liquids on the substrate W with the rinse liquid is executed (S5). The rinsing step is executed in a period, for example, of 35 seconds.

In the rinsing step, the facing member elevating/lowering unit 61 disposes the facing member 6 at a first processing position. When the facing member 6 is positioned at the first processing position, the facing surface 6a of the facing member 6 is separated from the upper surface of the substrate W by just a predetermined distance (for example, 30 mm).

The electric motor 23 then changes the rotational speed of the spin base 21 to a predetermined rinsing speed. The rinsing speed is, for example, 800 rpm. In this case, the rotational speed of the substrate W in the second peeling liquid supplying step is maintained in the rinsing step. The second DIW valve 55 is then opened. DIW is thereby supplied from the central nozzle 12 toward the upper surface of the substrate W in the rotating state. Then, while maintaining the state where the medium temperature DIW valve 124 (see FIG. 4) is opened, the $H_2O_2$ valve 125 (see FIG. 4) and the ammonia water valve 126 (see FIG. 4) are closed. The medium temperature DIW is thereby supplied from the lower surface nozzle 13 toward the lower surface of the substrate W in the rotating state.

The DIWs supplied to the upper surface and the lower surface of the substrate W spread across the entire upper surface of the substrate W due to the centrifugal force and replace the SC1 liquid. The DIWs supplied to the upper surface and the lower surface of the substrate W are eliminated radially outward from the substrate W due to the centrifugal force. The DIWs and the SC1 liquid eliminated from the substrate W are received by the first guard 71A.

A peeling liquid does not readily reach portions of the substrate W that are in contact with the first gripping pins 20A or the second gripping pins 20B. Thus, during execution of the second peeling liquid supplying step, a first separating step, in which the chuck unit 20 that is in the closed state is put in the first separated state, a second separating step, in which the chuck unit 20 is put in the second separated state, and a second substrate gripping step, in which the chuck unit 20 is put in the closed state again, are executed in that order. The peeling liquid can thereby be supplied sufficiently to the portions of the substrate W that are in contact with the first gripping pins 20A or the second gripping pins 20B. The particle holding layer 150 can thus be removed sufficiently from the upper surface of the substrate W in the holding layer removing step. The particle holding layer 150 attached to portions of the peripheral edge of the substrate W that are gripped by the first gripping pins 20A or the second gripping pins 20B is thereby peeled by the SC1 liquid.

Figure 7G:
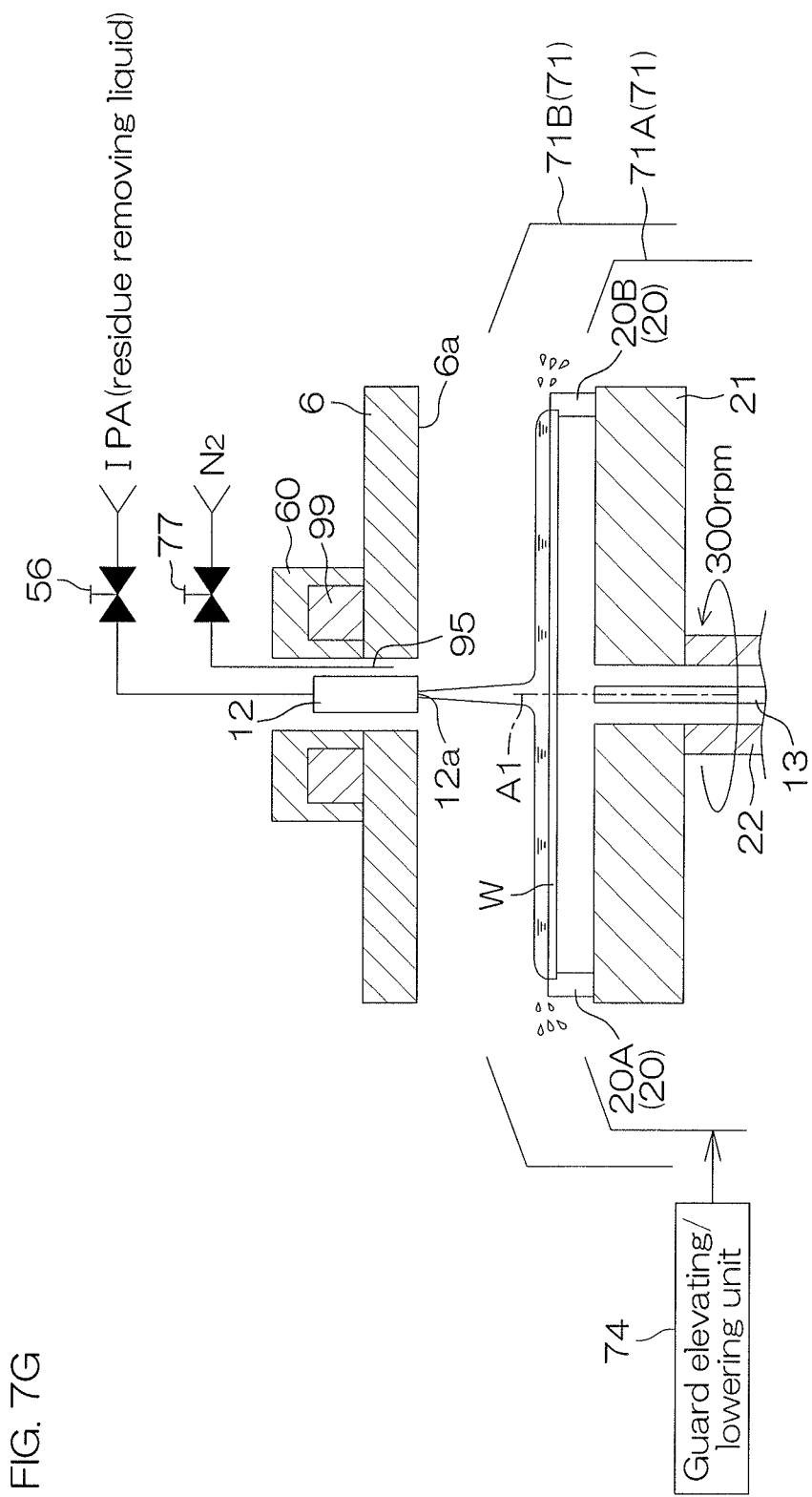

Referring to FIG. 7G, the residue removing step of supplying IPA as the residue removing liquid onto the substrate W after the rinsing step to remove a residue remaining on the upper surface of the substrate W after the particle holding layer 150 (see FIG. 7E) is removed is executed (S6). The residue removing step is executed in a period, for example, of 30 seconds.

In the residue removing step, the guard elevating/lowering unit 74 disposes the first guard 71A at the lower position. The electric motor 23 then changes the rotational speed of the spin base 21 to a predetermined residue removing speed. The residue removing speed is, for example, 300 rpm.

The second DIW valve 55 is then closed and in its place, the IPA valve 56 is opened. Thereby, the supply of DIW from the central nozzle 12 is stopped and in its place, IPA is supplied from the central nozzle 12 toward the upper surface of the substrate W in the rotating state. The processing fluid valve 59 and the medium temperature DIW valve 124 are then closed. The supply of the medium temperature DIW from the lower surface nozzle 13 to the lower surface of the substrate W is thereby stopped.

The IPA supplied to the upper surface of the substrate W spreads across the entire upper surface of the substrate W due to the centrifugal force and replaces the DIW on the substrate W. The IPA supplied to the upper surface of the substrate W is eliminated radially outward from the substrate W due to the centrifugal force. The DIW and the IPA eliminated from the substrate W are received by the second guard 71B.

Referring to FIG. 7H, after the particle holding layer 150 is removed from the substrate W (after the residue removing step), the liquid film forming step of supplying the second processing liquid to the upper surface of the substrate W to form a liquid film of the second processing liquid (second processing liquid film 160) covering the upper surface of the substrate W is executed (S7). The liquid film forming step is executed in a period, for example, of 30 seconds.

In the liquid film forming step, the facing member elevating/lowering unit 61 disposes the facing member 6 at a second processing position lower than the first processing position. When the facing member 6 is positioned at the second processing position, the facing surface 6a of the facing member 6 is separated from the upper surface of the substrate W by just a predetermined distance (for example, 10 mm). The electric motor 23 then changes the rotational speed of the spin base 21 to a predetermined liquid film forming speed. The liquid film forming speed is, for example, 300 rpm.

The second processing liquid valve 54 is then opened. The second processing liquid is thereby fed via the second processing liquid piping 44 toward the discharge port 12a of the central nozzle 12 (liquid feeding step). The second processing liquid is then discharged (supplied) from the discharge port 12a of the central nozzle 12 toward the upper surface of the substrate W (discharging step). The second processing liquid supplied to the upper surface of the substrate W spreads across the entire upper surface of the substrate W due to the centrifugal force and the IPA on the substrate W is replaced.

The processing fluid valve 59 and the medium temperature DIW valve 124 are then opened. Supply of the medium temperature DIW (third heat medium) from the lower surface nozzle 13 to the lower surface of the substrate W is thereby started. Since the temperature of the medium temperature DIW is, for example, 25° C., the temperature of the second processing liquid film 160 is held within a liquid film holding temperature range of not less than the melting point of the sublimable substance in the second processing liquid (for example, 20.5° C.) and less than the boiling point of the sublimable substance (for example, 82.5° C.).

The second processing liquid supplied to the upper surface of the substrate W and the DIW supplied to the lower surface of the substrate W are eliminated radially outward from the substrate W due to the centrifugal force. The IPA, DIW, and the second processing liquid eliminated from the substrate W are received by the second guard 71B.

Referring to FIG. 7I, while the temperature of the second processing liquid film 160 is within the temperature range of not less than the melting point of the sublimable substance in the second processing liquid and less than the boiling point of the sublimable substance, the film thinning step of removing a portion of the second processing liquid that constitutes the second processing liquid film 160 from the upper surface of the substrate W to thin the second processing liquid film 160 is executed (S8). The film thinning step is continued, for example, for 6 seconds. In the film thinning step, the facing member 6 is maintained at the second processing position and the second guard 71B is maintained at the lower position.

In the film thinning step, the second processing liquid valve 54 is closed. The discharge (supply) of the second processing liquid from the discharge port 12a of the central nozzle 12 to the upper surface of the substrate W is thereby stopped. That is, the discharging step is ended. On the other hand, the supply of the medium temperature DIW (third heat medium) from the lower surface nozzle 13 to the lower surface of the substrate W is continued. The temperature of the second processing liquid film 160 is thus held within the liquid film holding temperature range mentioned above after the supply of the second processing liquid in the liquid film forming step is stopped (temperature holding step).

The electric motor 23 then sets the rotational speed of the spin base 21 to a predetermined film thinning speed. The film thinning speed is, for example, 300 rpm. By rotating the substrate W while continuing the supply of the medium temperature DIW from the lower surface nozzle 13, the second processing liquid film 160 can be thinned by removing the second processing liquid from the upper surface of the substrate W while the temperature of the second processing liquid film 160 is within the liquid film holding temperature range. That is, the electric motor 23 functions as a removing unit that removes the second processing liquid on the substrate W.

The second processing liquid supplied to the upper surface of the substrate W and the DIW supplied to the lower surface of the substrate W are eliminated radially outward from the substrate W due to the centrifugal force. The DIW and the second processing liquid eliminated from the substrate W are received by the second guard 71B.

After the end of the discharging step, the second processing liquid remains in the second processing liquid piping 44 and the discharge port 12a. Thus, after the end of the above-stated discharging step, the suction valve 97 may be opened and the second processing liquid inside the second processing liquid piping 44 may be suctioned by the suction unit 98 (suctioning step).

By making the suction unit 98 suction the second processing liquid inside the second processing liquid piping 44, the second processing liquid can be removed from the second processing liquid piping 44 and the discharge port 12a before the second processing liquid solidifies.

The second processing liquid remaining inside the second processing liquid piping 44 and at the discharge port 12a can thus be suppressed or prevented from solidifying due to a heat amount of the second processing liquid remaining inside the second processing liquid piping 44 and at the discharge port 12a being lost due to heat of vaporization. Clogging of the second processing liquid piping 44 can thus be suppressed or prevented.

Further, at least in an interval from start of the liquid feeding step to end of the suctioning step, the heater 99 may be energized to hold a temperature inside the second processing liquid piping 44 within a control temperature range of not less than the melting point of the sublimable substance and less than the boiling point of the sublimable substance (processing liquid piping control temperature holding step).

The second processing liquid remaining inside the second processing liquid piping 44 can thereby be heated. Further, by heat of the heater 99 being transmitted from the second processing liquid piping 44 to the discharge port 12a of the central nozzle 12, the discharge port 12a is heated.

The heat amount of the second processing liquid remaining inside the second processing liquid piping 44 and at the discharge port 12a can thus be compensated.

Solidification of the second processing liquid remaining inside the second processing liquid piping 44 and at the discharge port 12a can thus be suppressed or prevented. The heater 99 thus functions as a second processing liquid piping temperature holding unit that holds the temperature inside the second processing liquid piping 44 within the control temperature range.

Referring to FIG. 7J, after the second processing liquid film 160 is thinned, a solidifying step of supplying the low temperature DIW (second heat medium) to the lower surface of the substrate W to cool the second processing liquid film 160 via the substrate W to a temperature not more than the melting point of the sublimating substance to make the second processing liquid film 160 solidify on the substrate W is executed (S9). In the solidifying step, the second processing liquid film 160 solidifies and a solid film 165 of the sublimable substance is formed. The solidifying step is continued, for example, for a period of 2 seconds. In the solidifying step, the facing member 6 is maintained at the second processing position. In the solidifying step, the first guard 71A is maintained at the upper position and the second guard 71B is maintained at the lower position.

The electric motor 23 then sets the rotational speed of the spin base 21 to a predetermined solidifying speed. The solidifying speed is, for example, 300 rpm. Then, the medium temperature DIW valve 124 is closed and the low temperature DIW valve 123 is opened. The low temperature DIW (second heat medium) is thereby supplied to the lower surface of the substrate W in place of the medium temperature DIW (third heat medium).

The temperature of the second processing liquid film 160 on the substrate W is thus made to approach the temperature (for example, 4° C. to 19° C.) of the low temperature DIW via the substrate W. Eventually, the temperature of the second processing liquid film 160 on the substrate W becomes not more than the melting point (for example, 20.5°

C.) of the sublimable substance and the second processing liquid film 160 thus solidifies.

A length of the film thinning step (film thinning period) can be adjusted by adjusting a timing at which the heat medium discharged from the lower surface nozzle 13 is switched from the medium temperature DIW to the low temperature DIW. By adjusting the length of the film thinning step, a film thickness of the solid film 165 of the second processing liquid can be adjusted. For example, the film thickness of the solid film 165 can be made smaller by making the film thinning period longer.

Figure 7K:
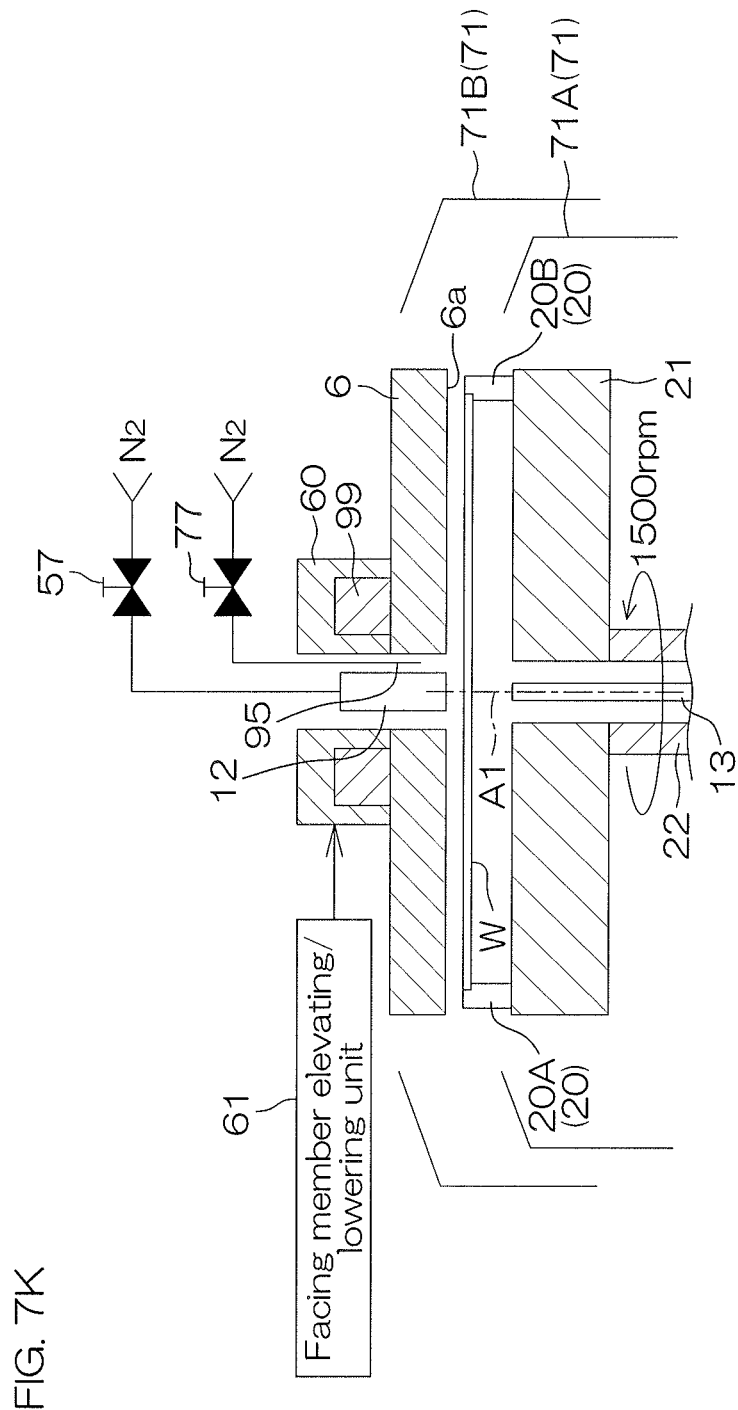

Referring to FIG. 7K, a sublimating step of sublimating the solid film 165 formed on the substrate W to remove the solid film 165 from the upper surface of the substrate W is executed (S10).

In the sublimating step, the facing member elevating/lowering unit 61 disposes the facing member 6 at a second proximity position. When positioned at the second proximity position, the facing member 6 is positioned just a predetermined distance (for example, 1.5 mm) above the upper surface of the substrate W. The electric motor 23 then sets the rotational speed of the spin base 21 to a predetermined sublimating speed. The sublimating speed is, for example, 1500 rpm. The processing fluid supplying valve 59 and the low temperature DIW valve 123 are then closed.

The first gas valve 57 is then opened. The gas is thereby supplied from the central nozzle 12 to the upper surface of the substrate W. By the supplied gas, the atmosphere between the facing surface 6a of the facing member 6 and the upper surface of the substrate W is dehumidified and dew condensation is prevented (dew condensation preventing step). Sublimation of the solid film 165 is promoted by the gas being made to flow above a front surface of the solid film 165 (sublimation promoting step). The central nozzle 12 functions as a sublimating unit that sublimates the solid film 165.

Further, an interior of the processing cup 7 is depressurized from a bottom portion of the processing cup 7 by the downflow formed by the FFU 29 and the exhaust apparatus 28. Thereby, the sublimation of the solid film 165 is promoted and dew condensation is prevented (dew condensation preventing step, sublimation promoting step). The FFU 29 and the exhaust apparatus 28 function as the sublimating unit that sublimates the solid film 165.

Figure 7L:
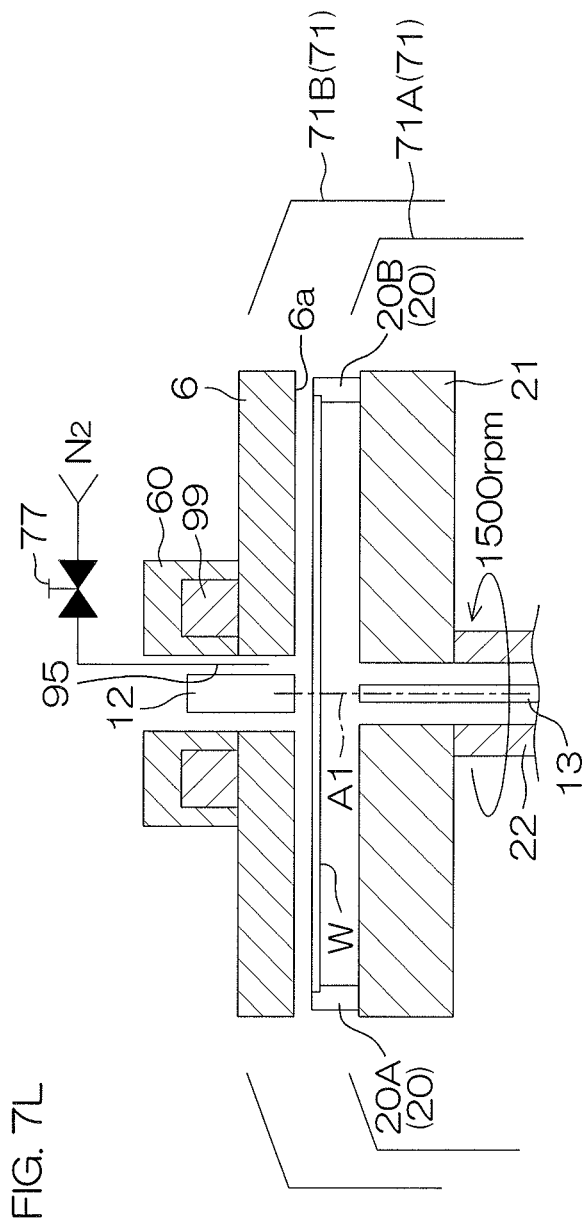

Then, referring to FIG. 7L, after the solid film 165 is removed from the upper surface of the substrate W, the drying step is executed to further dry the upper surface of the substrate W (S11).

In the drying step, the facing member 6 is maintained at the second proximity position. The electric motor 23 then sets the rotational speed of the spin base 21 to a predetermined drying speed. The drying speed is, for example, 1500 rpm. The first gas valve 57 is then closed. Supply of the gas from the central nozzle 12 is thereby stopped.

After the drying step, the rotation of the spin base 21 is stopped and the second gas valve 77 is closed to stop the supply of gas from the fifth tube 95. The facing member elevating/lowering unit 61 then disposes the facing member 6 at the upper position. Thereafter, the substrate carry-out step, in which the transfer robot CR enters into the processing unit 2, lifts up the processed substrate W from the spin chuck 5, and carries it outside the processing unit 2, is executed (S12). The substrate W is transferred from the transfer robot CR to the transfer robot IR and is housed in a carrier C by the transfer robot IR.

Thereafter, the plurality of first gripping pins 20A and the plurality of second gripping pins 20B may be cleaned before the next substrate W is carried into the processing unit 2 (gripping pin cleaning step). Specifically, the electric motor 23 rotates the spin base 21. Then, the second SC1 liquid valve 58 is opened to discharge the SC1 liquid from the side nozzle 14 toward the plurality of first gripping pins 20A and the plurality of second gripping pins 20B in the rotating state. Contaminants attached to the plurality of first gripping pins 20A and the plurality of second gripping pins 20B are thereby washed away before the next substrate W is carried into the processing unit 2. Attachment of particles to the substrate W that is subsequently held by the spin chuck 5 can thereby be suppressed.

After ending the cooling of the substrate W in the solidifying step, the processing fluid common piping 101 of the processing fluid supply piping 49 (heat medium supply piping) may be heated by the high temperature DIW (first heat medium) until the heating step of the next substrate W is started (heat medium supply piping heating step).

Specifically, in the state where the processing fluid supply valve 59 is closed, the high temperature DIW valve 122 and the liquid draw-off valve 127 are opened. An interior of the processing fluid common piping 101 is thereby heated by the high temperature DIW. By heating the processing fluid common piping 101 of the processing fluid supply piping 49 with the high temperature DIW in advance after the solidifying step, it is made possible, in the holding layer forming step of the substrate processing of the next substrate W, to heat the first processing liquid on the substrate W to the desired temperature.

With the present preferred embodiment, the first processing liquid supplying step, the holding layer forming step, the holding layer removing step, the liquid film forming step, the solidifying step, and the sublimating step are executed. The first processing liquid on the substrate W is heated by the high temperature DIW (first heat medium) via the substrate W in the holding layer forming step. By the first processing liquid thereby being solidified or cured, the particle holding layer 150 is formed on the upper surface of the substrate W. When the first processing liquid is being solidified or cured, the particles 151 are pulled away from the substrate W. The particles 151 that are pulled away become held inside the particle holding layer 150. Therefore, by supplying the peeling liquid to the upper surface of the substrate W in the holding layer removing step, the particle holding layer 150 can be peeled and removed, together with the held particles 151, from the upper surface of the substrate W.

Also, with the present method, the second processing liquid film 160 that covers the entirety of the upper surface of the substrate W is formed in the liquid film forming step. Then, in the solidifying step, the second processing liquid film 160 is cooled to the temperature (for example, 4° C. to 19° C.) not more than the melting point (20.5° C.) of the sublimable substance by supplying the low temperature DIW (second heat medium) and the solid film 165 is formed. The solid film 165 is removed by sublimation. Therefore, the second processing liquid can be removed from the substrate W and the upper surface of the substrate W can be dried without letting surface tension of the second processing liquid act on the upper surface of the substrate W. Collapse of the pattern formed on the upper surface of the substrate W can thus be suppressed or prevented.

By the above, the particles 151 can be removed satisfactorily from the upper surface of the substrate W and the upper surface of the substrate can be dried satisfactorily.

In the present preferred embodiment, the solute contained in the first processing liquid is the thermosensitive water-soluble resin. In the holding layer forming step, the substrate W is heated such that the temperature of the first processing liquid, supplied to the upper surface of the substrate W, becomes a temperature less than the alteration temperature and the particle holding layer 150 is formed.

Although the particle holding layer 150 is thus poorly soluble or insoluble in each peeling liquid, it can be peeled by the peeling liquid. Therefore, in the holding layer removing step, the particle holding layer 150 formed on the upper surface of the substrate W can be peeled and removed, without dissolving the particle holding layer 150 and with the particle holding layer 150 being in the state of holding the particles 151, from the upper surface of the substrate W.

Consequently, by peeling the particle holding layer 150, in the state of holding the particles 151, from the upper surface of the substrate W, the particles 151 can be removed at a high removal rate. Further, a residue, resulting from dissolution of the particle holding layer 150 in the peeling liquid, can be suppressed from remaining on or reattaching to the upper surface of the substrate W.

With the present preferred embodiment, in the holding layer forming step, the substrate W is heated such that the temperature of the first processing liquid supplied to the upper surface of the substrate W becomes less than the boiling point of the solvent. The solvent can thus be made to remain in the particle holding layer 150 after the heating in the holding layer forming step. The particle holding layer 150 can thus be made easily peelable from the upper surface of the substrate W in the subsequent holding layer removing step by interaction of the solvent remaining in the particle holding layer 150 and the peeling liquid that is supplied. That is, by making the peeling liquid permeate into the particle holding layer 150 and making the peeling liquid reach an interface between the particle holding layer 150 and the substrate W, the particle holding layer 150 can be lifted and peeled from the upper surface of the substrate W.

With the present preferred embodiment, the peeling liquid is the SC1 liquid or DIW, the solvent of the first processing liquid is PGEE, and the peeling liquid thus has compatibility with the solvent of the first processing liquid. When the solvent is made to remain appropriately in the particle holding layer 150 in the holding layer forming step, the peeling liquid that is compatible with the solvent can permeate into the particle holding layer 150 and reach the interface between the particle holding layer 150 and the substrate W. The particle holding layer 150 can thereby be lifted and peeled from the upper surface of the substrate W.

With the present preferred embodiment, after the holding layer removing step and before the liquid film forming step, the residue removing liquid, such as IPA, etc., is supplied to the upper surface of the substrate W to remove the residue remaining on the upper surface of the substrate W after the particle holding layer 150 is removed (residue removing step). The residue removing liquid has a property of dissolving the solute component that forms the particle holding layer. The residue of the particle holding layer 150 (the particle holding layer 150 that was not peeled by the peeling liquid) can thus be dissolved in the residue removing liquid to remove the residue from the upper surface of the substrate W before supplying the second processing liquid to the upper surface of the substrate W. The upper surface of the substrate W can thereby be dried in a state where an amount of particles on the upper surface of the substrate W is reduced further.

When volatilizing the solvent of the first processing liquid in the holding layer forming step, particles, resulting from the solvent, may become attached to the facing member 6 (member positioned in a vicinity of the substrate W). As an amount of the volatilized solvent increases, an amount of the particles attaching to the facing member 6 increases. After the holding layer removing step, the particles attaching to the facing member 6 may drift in the atmosphere inside the chamber 4 and become reattached to the substrate W. Especially when the facing member 6 is disposed at the second proximity position in the drying step, there is a high possibility for the particles attaching to the facing member 6 to separate from the facing member 6 and drift in the atmosphere inside the chamber 4. The amount of the particles attaching to the facing member 6 increases as the amount of the volatilized solvent increases.

Thus, in the present preferred embodiment, the rotation elimination step and the substrate heating step are executed in the holding layer forming step. In detail, after the first processing liquid is eliminated appropriately from the substrate by the rotation of the substrate W, the high temperature DIW (first heat medium) is supplied to the lower surface of the substrate to heat the first processing liquid on the substrate W. An amount of the solvent that volatilizes can thereby be reduced and an amount of the solvent attaching to the facing member 6 can thus be reduced. Reattachment of particles to the substrate W after the holding layer removing step can thus be suppressed.

With the present preferred embodiment, the temperature holding step and the film thinning step are executed. By holding the temperature of the second processing liquid film 160 within the liquid film holding temperature range in the temperature holding step, solidification of the second processing liquid film 160 can be suppressed and the second processing liquid on the substrate W can be maintained in a liquid phase before the solidifying step. For example, even if the second processing liquid film 160 undergoes partial solidification in the liquid film forming step, it can be remelted and put in liquid form in the temperature holding step.

In the film thinning step, by removing excess second processing liquid while the temperature of the liquid film of the second processing liquid is within the liquid film holding temperature range and the solidification of the second processing liquid film 160 does not occur, the film thickness of the solid film 165 formed in the solidifying step can be reduced appropriately. By reducing the film thickness of the solid film 165, an internal stress that remains in the solid film 165 can be reduced. A force that acts on the upper surface of the substrate W due to the internal stress can thus be reduced and pattern collapse can thus be suppressed further. Therefore, by sublimating and removing the solid film 165 in the subsequent sublimating step, the upper surface of the substrate W can be dried while further suppressing pattern collapse.

With the present preferred embodiment, the state in which the substrate W is held by the spin chuck 5 is continued until the sublimating step ends. The steps from the first processing liquid supplying step (S2) to the drying step (S11) can thus be executed inside the single chamber 4 without having to transfer the substrate W to another chamber in the middle of the substrate processing. Time necessary for processing the single substrate W (throughput) can thus be reduced.

Although, unlike in the present preferred embodiment, use of a heater, which can be elevated and lowered between the spin base 21 and the substrate W, as a heat medium may also be considered, when such a heater is used, it is difficult to adjust the temperature of the second processing liquid on the substrate W to a temperature lower than the melting point of the sublimable substance.

In detail, even when such a heater is separated maximally from the substrate W, the heater can only be lowered to a position of contacting the upper surface of the spin base 21. A temperature of a typical heater is 150° C. to 200° C. and, in many cases, the heater is constantly energized from a standpoint of throughput. Therefore, even if the heater is separated maximally from the substrate W, the substrate W would be heated by radiant heat from the heater and the temperature of the second processing liquid on the substrate W may become higher than the melting point (for example, 20.5° C.) of the sublimable substance. Even if the heater and the low temperature DIW are used in combination, the low temperature DIW may become heated by the heater and the temperature of the second processing liquid on the substrate W may become higher than the melting point of the sublimable substance.

Figure 9A:
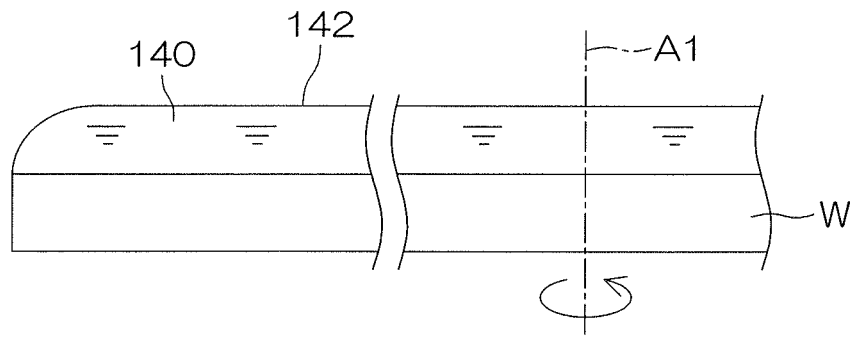
FIG. 9A and FIG. 9B are schematic views for describing a timing for starting heating of the substrate in a holding layer forming step (S3 of FIG. 6) of the substrate processing.
Figure 9B:
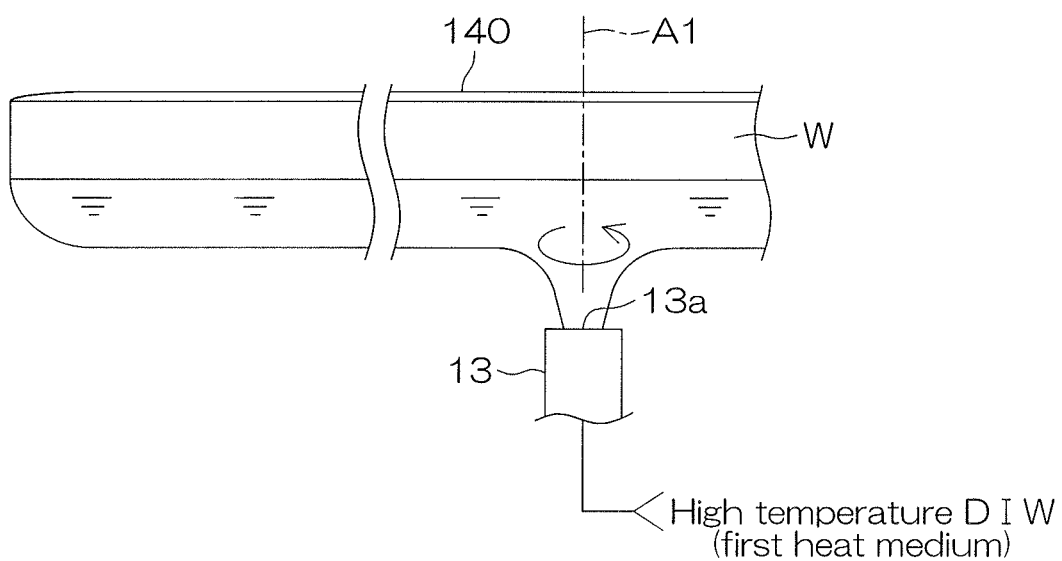

With the present preferred embodiment, a timing for starting the substrate heating step may be determined by the imaging unit 9. FIG. 9A and FIG. 9B are schematic views for describing the timing for starting the heating of the substrate W in the holding layer forming step (S3 of FIG. 6).

As shown in FIG. 9A, interference fringes 142 form on a front surface of a first processing liquid film 140. On the other hand, as shown in FIG. 9B, when the first processing liquid on the substrate W is eliminated by a centrifugal force to a degree such that the first processing liquid remains slightly across the entire upper surface of the substrate W (to a degree such that the first processing liquid 140 becomes extremely thin), the interference fringes 142 disappear from the upper surface of the substrate W. It is known that if the solvent of the first processing liquid is volatilized to form the particle holding layer 150 after the interference fringes 142 disappear, attachment of particles to the upper surface of the substrate W after the holding layer forming step can be suppressed.

Therefore, if, in the rotation elimination step, the imaging unit 9 detects the interference fringes 142 on the front surface of the first processing liquid film 140 (detecting step) and the lower surface nozzle 13 discharges the high temperature DIW to start the heating of the substrate W at a timing at which the interference fringes 142 are no longer detected (first heating starting step), an amount of the solvent of the first processing liquid to be volatilized can be reduced appropriately. Consequently, the forming of particles can be suppressed further.

The imaging unit 9 is thus an example of a detecting unit that detects the interference fringes 142. As the detecting unit, a light sensor, detecting a change in detected wavelength due to the forming of the interference fringes 142, etc., may be used besides the imaging unit 9.

The controller 3 may be programmed to judge that the interference fringes 142 are no longer detected when, for example, a state of the front surface of the first processing liquid film 140 does not change for a fixed time after the discharge of the first processing liquid from the discharge port 10a of the first moving nozzle 10 is stopped.

The present invention is not restricted to the preferred embodiment described above and may be implemented in yet other modes.

For example, with the preferred embodiment described above, it is described that, in the rotation elimination step, the imaging unit 9 detects the interference fringes 142 on the front surface of the first processing liquid film 140 (detecting step) and the heating of the substrate W is started at the timing at which the interference fringes 142 are no longer detected (first heating starting step). However, unlike in the preferred embodiment described above, the heating of the substrate in the holding layer forming step may be started after elapse of a predetermined time from the stopping of the supply of the first processing liquid (second heating starting step).

Figure 10A:
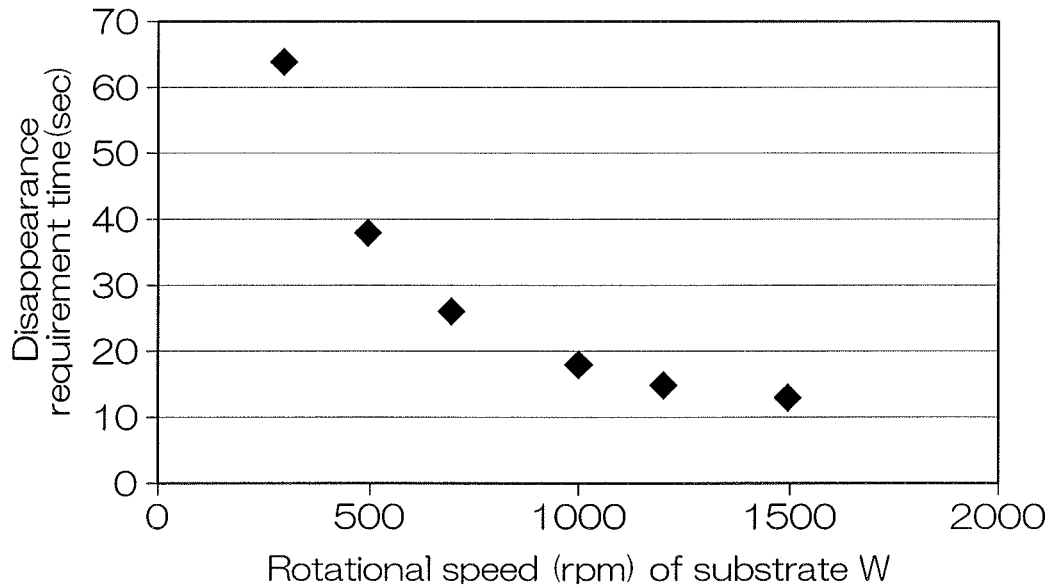
FIG. 10A is a graph showing disappearance requirement times at respective rotational speeds in cases, in each of which a substrate is rotated at a fixed rotational speed in a rotation elimination step in the holding layer forming step.

FIG. 10A is a graph showing times required until disappearance of the interference fringes 142 from the stopping of the supply of the first processing liquid (disappearance requirement times) at respective rotational speeds in cases, in each of which the substrate W is rotated at a fixed rotational speed in the rotation elimination step. In the graph of FIG. 10A, the solvent of the first processing liquid is PGEE. The abscissa of FIG. 10A is the rotational speed (rpm) of the substrate W and the ordinate of FIG. 10A is the disappearance requirement time (sec).

Figure 10B:
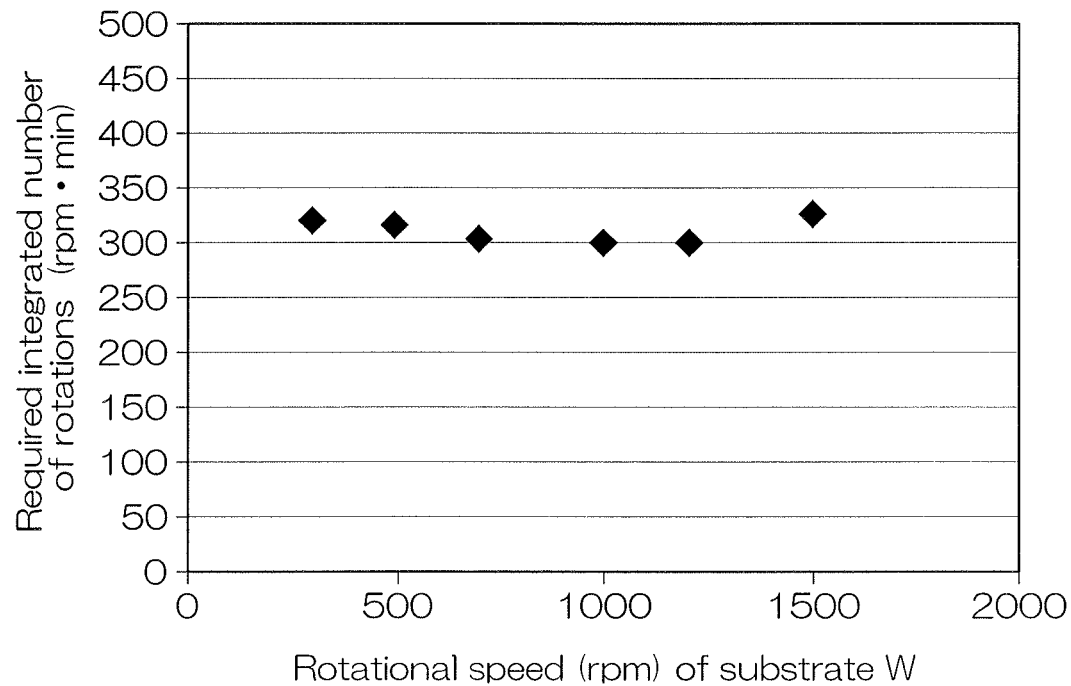
FIG. 10B is a graph showing integrated numbers of rotations at respective rotational speeds in cases, in each of which the substrate is rotated at a fixed rotational speed in the rotation elimination step.
Figure 11:
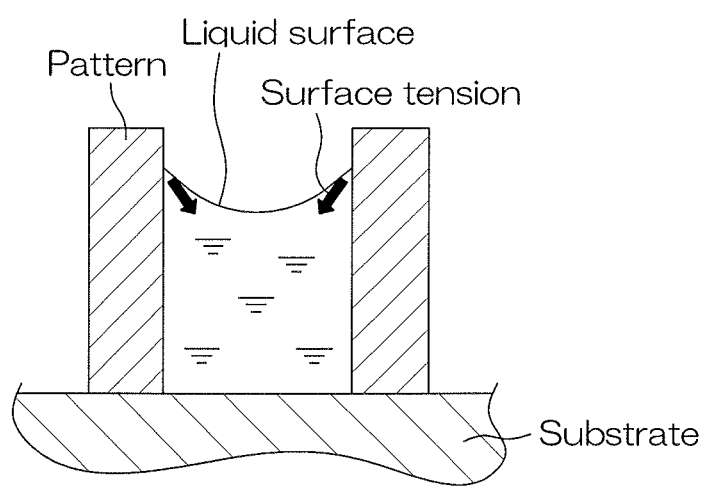
FIG. 11 is an illustrative sectional view for describing principles of pattern collapse due to surface tension.

FIG. 10B is a graph showing products of the rotational speed and the disappearance requirement time (required integrated numbers of rotations) at respective rotational speeds in cases, in each of which the substrate W is rotated at a fixed rotational speed in the rotation elimination step. The abscissa of FIG. 10B is the rotational speed (rpm) of the substrate W and the ordinate of FIG. 10B is the required integrated number of rotations (rpm-min).

As shown in FIG. 10A, the disappearance requirement time changes with the rotational speed of the substrate W. Also, the disappearance requirement time also changes with the type of the solvent of the first processing liquid. Therefore, if the heating of the substrate W is started after the disappearance requirement time that is in accordance with the rotational speed of the substrate W elapses from the stopping of the supply of the first processing liquid, the amount of the solvent of the first processing liquid to be volatilized can be reduced appropriately. Consequently, the forming of particles can be suppressed further.

As shown in FIG. 10B, the required integrated number of rotations was substantially fixed and not dependent on the rotational speed of the substrate W. Therefore, the required integrated number of rotations corresponding to PGEE may be acquired in advance. If the solvent of the first processing liquid is PGEE, the required integrated number of rotations is preferably set to not less than 300 rpm min. If the solvent of the first processing liquid is PGEE, the required integrated number of rotations is more preferably set to 400 rpm-min. Even when the solvent of the first processing liquid is a substance besides PGEE, the required integrated number of rotations can be acquired by evaluating a relationship of the required integrated number of rotations at respective rotational speeds.

The disappearance requirement time can be calculated from the rotational speed of the substrate W and the required integrated number of rotations acquired in advance. By arranging such that the heating of the substrate W is started after the calculated disappearance requirement time elapses from the stopping of the supply of the first processing liquid, the amount of the solvent of the first processing liquid to be volatilized can be reduced appropriately. Consequently, the forming of particles can be suppressed further.

With the modification example illustrated with FIG. 10A and FIG. 10B, an example where the rotational speed of the substrate W is fixed in the rotation elimination step is described. However, the rotational speed of the substrate W may be changed during the rotation elimination step. Even when the rotational speed of the substrate W is changed during the rotation elimination step, by setting a rotation elimination time such that a product of the rotation elimination time and the rotational speed of the substrate W (integrated number of rotations) becomes the required integrated number of rotations, the substrate heating step can be started in a state where the interference fringes 142 have been made to disappear. For example, if the solvent of the first processing liquid is PGEE, by setting the rotation elimination time such that the integrated number of rotations becomes not less than 300 rpm·min (preferably 400 rpm·min), the substrate heating step can be started in the state where the interference fringes 142 have been made to disappear.

Also, with the preferred embodiment described above, it is described that a thermosensitive water-soluble resin is used as the solute of the first processing liquid. However, the resin used as the solute of the first processing liquid may be a resin other than a thermosensitive water-soluble resin.

As examples of a resin, other than a thermosensitive water-soluble resin, to be used as the solute contained in the first processing liquid, acrylic resins, phenol resins, epoxy resins, melamine resins, urea resins, unsaturated polyester resins, alkyd resins, polyurethane, polyimide, polyethylene, polypropylene, polyvinyl chloride, polystyrene, polyvinyl acetate, polytetrafluoroethylene, acrylonitrile-butadiene-styrene resins, acrylonitrile-styrene resins, polyamide, polyacetal, polycarbonate, polyvinyl alcohol, modified polyphenylene ether, polybutylene terephthalate, polyethylene terephthalate, polyphenylene sulfide, polysulfone, polyether ether ketone, polyamide-imide, etc., can be cited. When any of these resins is used in the first processing liquid, any solvent that can dissolve the resin used as the solute may be used.

As the solute of the first processing liquid, a resin, other than a thermosensitive water-soluble resin, does not have an alteration temperature, and therefore in the substrate heating step in the particle holding layer forming step, there is no need, as in the case of using a thermosensitive water-soluble resin as the solute of the first processing liquid, for the temperature of the first processing liquid to be less than the alteration temperature of the thermosensitive water-soluble resin and it suffices to heat the substrate W such that the temperature of the first processing liquid on the substrate W is less than the boiling point of the solvent.

When a resin, other than a thermosensitive water-soluble resin, is used as the solute of the first processing liquid, any liquid having a dissolving ability with respect to any of the resins may be used as the residue removing liquid. When a resin, other than a thermosensitive water-soluble resin, is used as the solute of the first processing liquid, for example, an organic solvent, such as a thinner, toluene, an acetate ester, an alcohol, a glycol, etc., or an acidic liquid, such as acetic acid, formic acid, hydroxyacetic acid, etc., may be used as the residue removing liquid.

Besides the various resins mentioned above, for example, an organic compound other than a resin or a mixture of an organic compound and another substance may be used as the solute of the first processing liquid. Or, the solute may be a compound other than an organic compound.

As the peeling liquid, another peeling liquid that is not water-based may be used. In this case, a solute, which forms a particle holding layer 150 that is poorly soluble or insoluble in the peeling liquid, a solvent, which has compatibility with the peeling liquid and has a dissolving ability with respect to the solute, a residue removing liquid, having compatibility with the peeling liquid and has a dissolving ability with respect to the solute, etc., should be combined as appropriate.

As the second processing liquid used in the preferred embodiment above and the modifications thereof, that which contains the sublimable substance in the molten state, such as the melt of the sublimable substance, etc., or a solution, having the sublimable substance dissolved as a solute in a solvent, etc., may be used as described above.

As the sublimable substance, for example, hexamethylenetetramine, 1,3,5-trioxane, ammonium 1-pyrrolidine carbodithioate, metaldehyde, paraffin with approximately 20 to 48 carbon atoms, t-butanol, para-dichlorobenzene, naphthalene, L-menthol, or a fluorohydrocarbon compound, etc., is used. In particular, a fluorohydrocarbon compound may be used as the sublimable substance. As the sublimable substance, 1,1,2,2,3,3,4-heptafluorocyclopentane, used in the above description of the preferred embodiment, is especially preferable.

As specific examples of the fluorohydrocarbon compound, for example, one type or two or more types of the following compounds (A) to (E) may be used.

Compound (A): A fluoroalkane with 3 to 6 carbon atoms or a derivative thereof.

Compound (B): A fluorocycloalkane with 3 to 6 carbon atoms or a derivative thereof.

Compound (C): A fluorobicycloalkane with 10 carbon atoms or a derivative thereof.

Compound (D): Fluorotetracyanoquinodimethane or a derivative thereof.

Compound (E): A fluorocyclophosphazene with 3 or more phosphazene units or a derivative thereof.

<Compound A>

As the compound (A), a fluoroalkane with 3 to 6 carbon atoms, expressed by formula (1):

$$C_m H_n F_{2m+2-n} \quad (1)$$

(In the formula, m indicates a number from 3 to 6 and n indicates a number such that $0 \le n \le 2m+1$.) or a derivative thereof can be cited.

Specifically, as examples of the fluoroalkane with 3 carbon atoms, $CF_3CF_2CF_3$, $CHF_2CF_2CF_3$, $CH_2FCF_2CF_3$, $CH_3CF_2CH_3$, $CHF_2CF_2CH_3$, $CH_2FCF_2CH_3$, $CH_2FCF_2CH_2F$, $CHF_2CF_2CHF_2$, $CF_3CHFCF_3$, $CH_2FCHFCF_3$, $CHF_2CHFCF_3$, $CH_2FCHFCH_2F$, $CHF_2CHFCHF_2$, $CH_3CHFCH_3$, $CH_2FCHFCH_3$, $CHF_2CHFCH_3$, $CF_3CH_2CF_3$, $CH_2FCH_2CF_3$, $CHF_2CH_2CF_3$, $CH_2FCH_2CH_2F$, $CH_2FCH_2CHF_2$, $CHF_2CH_2CHF_2$, $CH_3CH_2CH_2F$, $CH_3CH_2CHF_2$, etc., can be cited.

As examples of the fluoroalkane with 4 carbon atoms, $CF_3(CF_2)_2CF_3$, $CF_3(CF_2)_2CH_2F$, $CF_3CF_2CH_2CF_3$, $CHF_2(CF_2)_2CHF_2$, $CHF_2CHFCF_2CHF_2$, $CF_3CH_2CF_2CHF_2$, $CF_3CHFCH_2CF_3$, $CHF_2CHFCHFCHF_2$, $CF_3CH_2CF_2CH_3$, $CF_3CF_2CH_2CH_3$, $CF_3CHFCF_2CH_3$, $CHF_2CH_2CF_2CH_3$, etc., can be cited.

As examples of the fluoroalkane with 5 carbon atoms, $CF_3(CF_2)_3CF_3$, $CF_3CF_2CF_2CHFCF_3$, $CHF_2(CF_2)_3CF_3$, $CHF_2(CF_2)_3CHF_2$, $CF_3CH(CF_3)CH_2CF_3$, $CF_3CHFCF_2CH_2CF_3$, $CF_3CF(CF_3)CH_2CHF_2$, $CHF_2CHFCF_2CHFCHF_2$, $CF_3CH_2CF_2CH_2CF_3$, 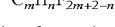 $(CF_2)_2CHFCH_3$, $CHF_2CH_2CF_2CH_2CHF_2$, $CF_3(CH_2)_3CF_3$, $CF_3CHFCHFCF_2CF_3$, etc., can be cited.

As examples of the fluoroalkane with 6 carbon atoms, $CF_3(CF_2)_4CF_3$, $CF_3(CF_2)_4CHF_2$, $CF_3(CF_2)_4CH_2F$, $CF_3CH(CF_3)CHFCF_2CF_3$, $CHF_2(CF_2)_4CHF_2$, $CF_3CF_2CH_2CH(CF_3)CF_3$, $CF_3CF_2(CH_2)_2CF_2CF_3$, $CF_3CH_2(CF_2)_2CH_2CF_3$, $CF_3(CF_2)_3CH_2CF_3$, $CF_3CH(CF_3)(CH_2)_2CF_3$, $CHF_2CF_2(CH_2)_2CF_2CHF_2$, $CF_3(CF_2)_2(CH_2)_2CH_3$, etc., can be cited.

Also, as the derivative of the fluoroalkane with 3 to 6 carbon atoms, a compound, with which at least one type of substituent, selected from the group consisting of halogens other than fluorine (specifically, chlorine, bromine, and iodine), a hydroxyl group, an oxygen atom, alkyl groups, a carboxyl group, and perfluoroalkyl groups, is substituted in any of the fluoroalkanes mentioned above, etc., can be cited.

As examples of the alkyl group, a methyl group, ethyl group, n-propyl group, isopropyl group, n-butyl group, t-butyl group, etc., can be cited.

As examples of the perfluoroalkyl group, saturated perfluoroalkyl groups and unsaturated perfluoroalkyl groups can be cited. Also, the perfluoroalkyl group may be of either a straight-chain structure or a branched structure. As examples of the perfluoroalkyl group, for example, a trifluoromethyl group, perfluoroethyl group, perfluoro-n-propyl group, perfluoroisopropyl group, perfluoro-n-butyl group, perfluoro-sec-butyl group, perfluoro-tert-butyl group, perfluoro-n-amyl group, perfluoro-sec-amyl group, perfluoro-tert-amyl group, perfluoroisoamyl group, perfluoro-n-hexyl group, perfluoroisohexyl group, perfluoroneohexyl group, perfluoro-n-heptyl group, perfluoroisoheptyl group, perfluoroneoheptyl group, perfluoro-n-octyl group, perfluoroisooctyl group, perfluoroneooctyl group, perfluoro-n-nonyl group, perfluoroneononyl group, perfluoroisononyl group, perfluoro-n-decyl group, perfluoroisodecyl group, perfluoroneodecyl group, perfluoro-sec-decyl group, perfluoro-tert-decyl group, etc., can be cited.

<Compound B>

As the compound (B), a fluorocycloalkane with 3 to 6 carbon atoms, expressed by formula (2):

$$C_mH_nF_{2m-n} \qquad (2)$$

(In the formula, m indicates a number from 3 to 6 and n indicates a number such that $0 \leq n \leq 2m-1$.) or a derivative thereof can be cited.

Specifically, as examples of the fluorocycloalkane with 3 to 6 carbon atoms, monofluorocyclohexane, dodecafluorocyclohexane, 1,1,4-trifluorocyclohexane, 1,1,2,2-tetrafluorocyclobutane, 1,1,2,2,3-pentafluorocyclobutane, 1,2,2,3,3,4-hexafluorocyclobutane, 1,1,2,2,3,3-hexafluorocyclobutane, 1,1,2,2,3,4-hexafluorocyclobutane, 1,1,2,2,3,3-hexafluorocyclopentane, 1,1,2,2,3,4-hexafluorocyclopentane, 1,1,2,2,3,3,4-heptafluorocyclopentane, 1,1,2,2,3,4,5-heptafluorocyclopentane, 1,1,2,2,3,3,4,4-octafluorocyclopentane, 1,1,2,2,3,3,4,5-octafluorocyclopentane, 1,1,2,2,3,4,5,6-octafluorocyclohexane, 1,1,2,2,3,3,4,4-octafluorocyclohexane, 1,1,2,2,3,3,4,5-octafluorocyclohexane, 1,1,2,2,3,3,4,4,5,6-nonafluorocyclohexane, 1,1,2,2,3,3,4,4,5-nonafluorocyclohexane, 1,1,2,2,3,3,4,5,6-nonafluorocyclohexane, 1,1,2,2,3,4,5,5,6-decafluorocyclohexane, 1,1,2,2,3,3,4,4,5,6-decafluorocyclohexane, 1,1,2,2,3,3,4,4,5,5-decafluorocyclohexane, 1,1,2,2,3,3,4,4,5,6-decafluorocyclohexane, perfluorocyclopropane, perfluorocyclobutane, perfluorocyclopentane, perfluorocyclohexane, etc., can be cited.

Also, as the derivative of the fluorocycloalkane with 3 to 6 carbon atoms, a compound, with which at least one type of substituent, disclosed for the compound (A), is substituted in any of the fluorocycloalkanes mentioned above, etc., can be cited.

As specific examples of the derivative of the fluorocycloalkane with 3 to 6 carbon atoms, for example, 1,2,2,3,3-tetrafluoro-1-trifluoromethylcyclobutane, 1,2,4,4-tetrafluoro-1-trifluoromethylcyclobutane, 2,2,3,3-tetrafluoro-1-trifluoromethylcyclobutane, 1,2,2-trifluoro-1-trimethylcyclobutane, 1,4,4,5,5-pentafluoro-1,2,2,3,3-pentamethylcyclopentane, 1,2,5,5-tetrafluoro-1,2-dimethylcyclopentane, 3,3,4,4,5,5,6,6-octafluoro-1,2-dimethylcyclohexane, 1,1,2,2-tetrachloro-3,3,4,4-tetrafluorocyclobutane, 2-fluorocyclohexanol, 4,4-difluorocyclohexanone, 4,4-difluorocyclohexanecarboxylic acid, 1,2,2,3,3,4,4,5,5,6,6-undecafluoro-1-(nonafluorobutyl)cyclohexane, perfluoromethylcyclopropane, perfluorodimethylcyclopropane, perfluorotrimethylcyclopropane, perfluoromethylcyclobutane, perfluorodimethylcyclobutane, perfluorotrimethylcyclobutane, perfluoromethylcyclopentane, perfluorodimethylcyclopentane, perfluorotrimethylcyclopentane, perfluoromethylcyclohexane, perfluorodimethylcyclohexane, perfluorotrimethylcyclohexane, etc., can be cited.

<Compound (C)>

As the fluorobicycloalkane with 10 carbon atoms of the compound (C), for example, fluorobicyclo[4.4.0]decane, fluorobicyclo[3.3.2]decane, perfluorobicyclo[4.4.0]decane, perfluorobicyclo[3.3.2]decane, etc., can be cited.

Also, as the compound (C), a derivative with which a substituent is bonded to the fluorobicycloalkane with 10 carbon atoms can be cited. As the substituent, a halogen other than fluorine (specifically, chlorine, bromine, or iodine), a cycloalkyl group that may have a halogen atom, or an alkyl group having a cycloalkyl group that may have a halogen atom can be cited.

In the cycloalkyl group that may have a halogen atom, fluorine, chlorine, bromine, or iodine can be cited as the halogen atom. Also, as the cycloalkyl group that may have a halogen atom, a cyclopropyl group, cyclobutyl group, cyclopentyl group, cyclohexyl group, cycloheptyl group, perfluorocyclopropyl group, perfluorocyclobutyl group, perfluorocyclopentyl group, perfluorocyclohexyl group, perfluorocycloheptyl group, etc., can be cited.

In the alkyl group having a cycloalkyl group that may have a halogen atom, fluorine, chlorine, bromine, or iodine can be cited as the halogen atom. Also, in the alkyl group having a cycloalkyl group that may have a halogen atom, a cyclopropyl group, cyclobutyl group, cyclopentyl group, cyclohexyl group, cycloheptyl group, perfluorocyclopropyl group, perfluorocyclobutyl group, perfluorocyclopentyl group, perfluorocyclohexyl group, perfluorocycloheptyl group, etc., can be cited as the cycloalkyl group that may have a halogen atom. As a specific example of the alkyl group having a cycloalkyl group that may have a halogen atom, for example, a difluoro(undecafluorocyclohexyl)methyl group, etc., can be cited.

As specific examples of the compound (C) with which a substituent is bonded to the fluorobicycloalkane with 10 carbon atoms, for example, 2-[difluoro(undecafluorocyclohexyl)methyl]-1,1,2,3,3,4,4,4a,5,5,6,6,7,7,8,8,8a-heptadecafluorodecahydronaphthalene, etc., can be cited.

<Compound (D)>

As the fluorotetracyanoquinodimethane of the compound (D), for example, tetrafluorotetracyanoquinodimethane, etc., can be cited.

Also, as the compound (D), a derivative with which at least one halogen other than fluorine (specifically, chlorine, bromine, or iodine) is bonded to the fluorotetracyanoquinodimethane can be cited.

<Compound (E)>

As the fluorocyclophosphazene of the compound (E), hexafluorocyclotriphosphazene, octafluorocyclotetraphosphazene, decafluorocyclopentaphosphazene, dodecafluorocyclohexaphosphazene, etc., can be cited.

Also, as the compound (E), a derivative with which a substituent is bonded to the fluorocyclophosphazene can be cited. As the substituent, a halogen other than fluorine (specifically, chlorine, bromine, or iodine), phenoxy group, alkoxy group (—OR group), etc., can be cited. As the R of the alkoxy group, for example, an alkyl group, such as a methyl group, ethyl group, etc., a fluoroalkyl group, such as a trifluoromethyl group, etc., an aromatic group, such as a phenyl group, etc., etc., can be cited.

As examples of the compound (E) with which a substituent is bonded to the fluorocyclophosphazene, hexachlorocyclotriphosphazene, octachlorocyclotetraphosphazene, decachlorocyclopentaphosphazene, dodecachlorocyclohexaphosphazene, hexaphenoxycyclotriphosphazene, etc., can be cited.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
    a substrate holding step of horizontally holding a substrate;
    a first processing liquid supplying step of supplying a first processing liquid, containing a solute and a solvent having volatility, to an upper surface of the substrate;
    a holding layer forming step of supplying a first heat medium to a lower surface of the substrate to heat the first processing liquid on the substrate via the substrate and volatilize at least a portion of the solvent to solidify or cure the first processing liquid to form a particle holding layer on the upper surface of the substrate;
    a holding layer removing step of supplying a peeling liquid, which peels the particle holding layer, to the upper surface of the substrate to peel and remove the particle holding layer from the upper surface of the substrate;
    a liquid film forming step of supplying, after removing the particle holding layer from the substrate, a second processing liquid, containing a sublimable substance, to the upper surface of the substrate to form a liquid film of the second processing liquid which covers the upper surface of the substrate;
    a solidifying step of supplying a second heat medium to the lower surface of the substrate to cool the liquid film via the substrate to a temperature not higher than a melting point of the sublimable substance to make the liquid film solidify to form a solid film on the substrate; and
    a sublimating step of sublimating and thereby removing the solid film from the substrate,
    wherein the holding layer forming step includes a rotation elimination step of rotating the substrate around a rotational axis oriented along a vertical direction to eliminate a portion of the first processing liquid from the substrate,
    the method further comprises a detecting step of detecting interference fringes of the first processing liquid on the substrate,
    the holding layer forming step includes a first heating starting step of starting the supplying of the first heat medium at a timing at which the interference fringes are no longer detected, and
    the first heating starting step starts the supplying of the first heat medium after stopping the supplying of the first processing liquid in the first processing liquid supplying step, and after an integrated number of rotations reaches a required integrated number of rotations, the required integrated number of rotations being a product of a rotational speed of the rotating substrate and a disappearance requirement time which is a time required until disappearance of the interference fringes.

2. The substrate processing method according to claim 1, further comprising: a temperature holding step of supplying a third heat medium to the lower surface of the substrate to hold a temperature of the liquid film, after the supplying of the second processing liquid in the liquid film forming step is stopped, within a temperature range of not lower than the melting point of the sublimable substance and lower than a boiling point of the sublimable substance; and
    a film thinning step of removing a portion of the second processing liquid, constituting the liquid film, from the upper surface of the substrate while the temperature of the liquid film is within the temperature range to thin the liquid film.

3. The substrate processing method according to claim 1, further comprising: a guard disposing step of disposing a guard at a side of the substrate in the first processing liquid supplying step; and
    a proximity disposing step of disposing a facing member, having a facing surface facing the upper surface of the substrate, at a proximity position in proximity to the upper surface of the substrate in the holding layer forming step.

4. The substrate processing method according to claim 3, wherein the liquid film forming step includes a liquid feeding step of feeding the second processing liquid toward a discharge port, provided at the facing surface of the facing member, via a second processing liquid piping, a discharging step of discharging the second processing liquid toward the upper surface of the substrate from the discharge port, and a suctioning step of suctioning the second processing liquid inside the second processing liquid piping after end of the discharging step.

5. The substrate processing method according to claim 4, further comprising: a processing liquid piping temperature holding step of holding a temperature of the second processing liquid piping within a control temperature range of not lower than the melting point of the sublimable substance and lower than a boiling point of the sublimable substance.

6. The substrate processing method according to claim 1, wherein the substrate holding step includes holding the substrate by a substrate holding unit until the sublimating step ends.

7. The substrate processing method according to claim 6, wherein the substrate holding step includes a first substrate gripping step of gripping the substrate by both a plurality of first gripping pins and a plurality of second gripping pins provided in the substrate holding unit, a first separating step of gripping the substrate by the plurality of second gripping pins and separating the plurality of first gripping pins from the substrate, a second separating step of gripping the substrate by the plurality of first gripping pins and separating the plurality of second gripping pins from the substrate, and a second substrate gripping step of gripping the substrate by both the plurality of first gripping pins and the plurality of second gripping pins after the first separating step and the second separating step, and
    the first separating step, the second separating step, and the second substrate gripping step are executed while the peeling liquid is being supplied onto the substrate in the holding layer removing step.

* * * * *